US012703624B2

(12) United States Patent
Huang

(10) Patent No.: US 12,703,624 B2
(45) Date of Patent: Aug. 11, 2026

(54) METHODS FOR FABRICATION OF MEMS DEVICE

(71) Applicant: Omnitron Sensors Inc., Los Angeles, CA (US)

(72) Inventor: Trent Huang, Los Angeles, CA (US)

(73) Assignee: OMNITRON SENSORS INC., Los Angeles, CA (US)

(*) Notice: Subject to any disclaimer, the term of this patent is extended or adjusted under 35 U.S.C. 154(b) by 395 days.

(21) Appl. No.: 18/409,384

(22) Filed: Jan. 10, 2024

(65) Prior Publication Data

US 2024/0327206 A1 Oct. 3, 2024

Related U.S. Application Data

(60) Provisional application No. 63/492,946, filed on Mar. 29, 2023.

(51) Int. Cl.

*B81C 1/00* (2006.01)
*B81B 3/00* (2006.01)
*G02B 26/08* (2006.01)

(52) U.S. Cl.

CPC ........ *B81C 1/00301* (2013.01); *B81B 3/0054* (2013.01); *G02B 26/0833* (2013.01); *B81B 2201/042* (2013.01); *B81C 2201/0133* (2013.01)

(58) Field of Classification Search

CPC .. B81C 1/0031; B81B 3/0054; G02B 26/0833
See application file for complete search history.

(56) References Cited

U.S. PATENT DOCUMENTS

| | | | | |
|---|---|---|---|---|
| 6,600,850 | B1 | 7/2003 | Fan | |
| 9,034,764 | B2 * | 5/2015 | O'Brien | B81C 1/00063 438/702 |
| 10,276,791 | B1 * | 4/2019 | Hung | G11C 13/0007 |
| 2002/0170290 | A1 | 11/2002 | Bright et al. | |
| 2002/0180311 | A1 | 12/2002 | Yeh et al. | |
| 2003/0049879 | A1 | 3/2003 | Lin | |
| 2009/0122383 | A1 | 5/2009 | Reyes et al. | |
| 2017/0107097 | A1 * | 4/2017 | Cheng | B81C 1/00301 |
| 2019/0245515 | A1 * | 8/2019 | Hurwitz | H03H 9/173 |
| 2019/0382258 | A1 * | 12/2019 | Lee | B81C 1/00301 |
| 2021/0305291 | A1 * | 9/2021 | Liao | H10F 39/8067 |
| 2024/0383743 | A1 * | 11/2024 | Liao | B81B 7/02 |

OTHER PUBLICATIONS

International Search Report and Written Opinion for International Patent App. No. PCT/US24/22215, dated Jul. 12, 2024 (13 Pages).

* cited by examiner

*Primary Examiner* — Mounir S Amer
(74) *Attorney, Agent, or Firm* — NIXON PEABODY LLP

(57) ABSTRACT

A system and method for fabricating a micro-electromechanical system (MEMS) device is disclosed. A device layer, a handle layer and a buried oxide layer between the handle layer and the device wafer are formed. A top trench is created in a top surface of the device layer. An oxide layer is created over the top surface of the device layer and the top trench. The top of the device layer and the top trench is coated with a polysilicon layer. The oxide layer of the top trench or the top of the device layer is selectively etched away to create a structure. A bottom trench is created through the handle layer under the structure.

20 Claims, 21 Drawing Sheets

METHODS FOR FABRICATION OF MEMS DEVICE

PRIORITY CLAIM

The present disclosure claims benefit of and priority to U.S. Provisional Ser. No. 63/492,946, filed Mar. 29, 2023. The contents of that application are hereby incorporated by reference in their entirety.

TECHNICAL FIELD

The present disclosure relates generally to fabrication of MEMS structures. More particularly, aspects of this disclosure relate to a method of fabricating various MEMS structures.

BACKGROUND

Micro-electromechanical systems (MEMS) are microscopic devices incorporating both electronic devices and physical moving parts. A typical MEMS device is fabricated using integrated circuit techniques on a silicon wafer or wafers. The fabrication process creates the physical moving parts from fabricating different materials that may be deposited on and etched out of the substrate wafer.

MEMS have numerous applications such as in microphones, sensors, accelerometers, and light detection and ranging (LIDAR) systems. MEMS fabrication is intrinsically two dimensional to create physical structures on a substrate. Custom offsets of such structures add another dimension to MEMS topology and functionality. However, offsetting structures are often defined/limited by the dimensions of external tools and/or assembly accuracy from the fabrication process. It is desirable for such structures to have high strength to weight ratios, defined surfaces, and other features. However, fabrication of structures with such features is a challenge with existing fabrication techniques.

Thus, there is a need for a MEMS fabrication process that allows for the efficient creation of structures with a variety of well defined three-dimensional features. There is another need for a fabrication process that allows creation of isolated MEMS devices. There is another need for a fabrication process that allows creation of releasable MEMS structures with relatively flat surfaces.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the entire specification of this disclosure, any or all drawings and each claim.

One disclosed example is a method for fabricating a micro-electromechanical systems (MEMS) device. A device layer, a handle layer, and a buried oxide layer between the handle layer and the device wafer are provided. A top trench is created in a top surface of the device layer. An oxide layer is created over the top surface of the device layer and the top trench. The top of the device layer and the top trench are coated with a first polysilicon layer. The oxide layer of the top trench or the top of the device layer are etched away to create a structure. A bottom trench is created through the handle layer under the created structure.

In another disclosed implementation of the example method, the height of the bottom trench is defined by a length of the handle layer to the buried oxide layer. In another disclosed implementation, the bottom trench extends through the buried oxide layer and partially through the device layer. In another disclosed implementation, the structure includes the material of the device layer. In another disclosed implementation, the example method further includes fabricating a bottom cap layer having a cavity; and bonding the bottom cap layer with a bottom surface of the handle wafer to align the cavity with the bottom trench. In another disclosed implementation, the example method includes fabricating top cap support structures on the device layer; and joining a lid to the support structures over the structure to create a hermetic seal over the structure. In another disclosed implementation, the top cap layer is tilted. In another disclosed implementation, the top trench is a deep isolation trench extending through the thickness of the device layer to the buried oxide layer. The method includes removing material of the device layer along the deep isolation trench to release the structure. In another disclosed implementation, the top trench is a shallow breakup trench shallower than the thickness of the device layer. In another disclosed implementation, the structure is formed from the first polysilicon layer in the trench after the oxide layer is etched away. In another disclosed implementation, the oxide layer is a sacrificial layer of a specified thickness to form a capacitive gap of the specified thickness between the structure and the device layer. In another disclosed implementation, the structure is defined by the top trench formed from the device layer after the oxide layer is etched away. In another disclosed implementation, the example method includes etching a second trench after the oxide layer is created. In another disclosed implementation, the example method includes providing a second polysilicon layer on the oxide layer; and patterning the second polysilicon layer to form a part of the structure. In another disclosed implementation, the example method includes depositing a patterned metal layer on the first polysilicon layer. In another disclosed implementation, the device is a mirror formed of the patterned metal layer, and the structure may be moved at an angle relative to the surface of the device layer. In another disclosed implementation, the device layer and the handle layer are fabricated from single crystalline silicon. In another disclosed implementation, the device is a comb actuator and the structure is a tooth of the comb actuator. In another disclosed implementation, the oxide layer is formed into a sacrificial block that is etched away to create large spatial gaps in the structure.

Another disclosed example is a method of fabricating a micro-electromechanical systems (MEMS) comb actuator. An isolation trench is etched in a substrate layer. Finger defining trenches are etched in the substrate layer. The finger defining trenches are perpendicular to the isolation trench. An oxide layer is grown to fill the isolation trench and coat the sides of the finger defining trenches. A polysilicon layer is grown to fill the finger defining trenches. The oxide layer coating the sides of the finger defining trenches and filling the isolation trench is etched away to create polysilicon fingers separated by a gap from fingers of the substrate layer.

BRIEF DESCRIPTION OF THE DRAWINGS

The disclosure will be better understood from the following description of exemplary embodiments together with reference to the accompanying drawings, in which.

Figure 1:
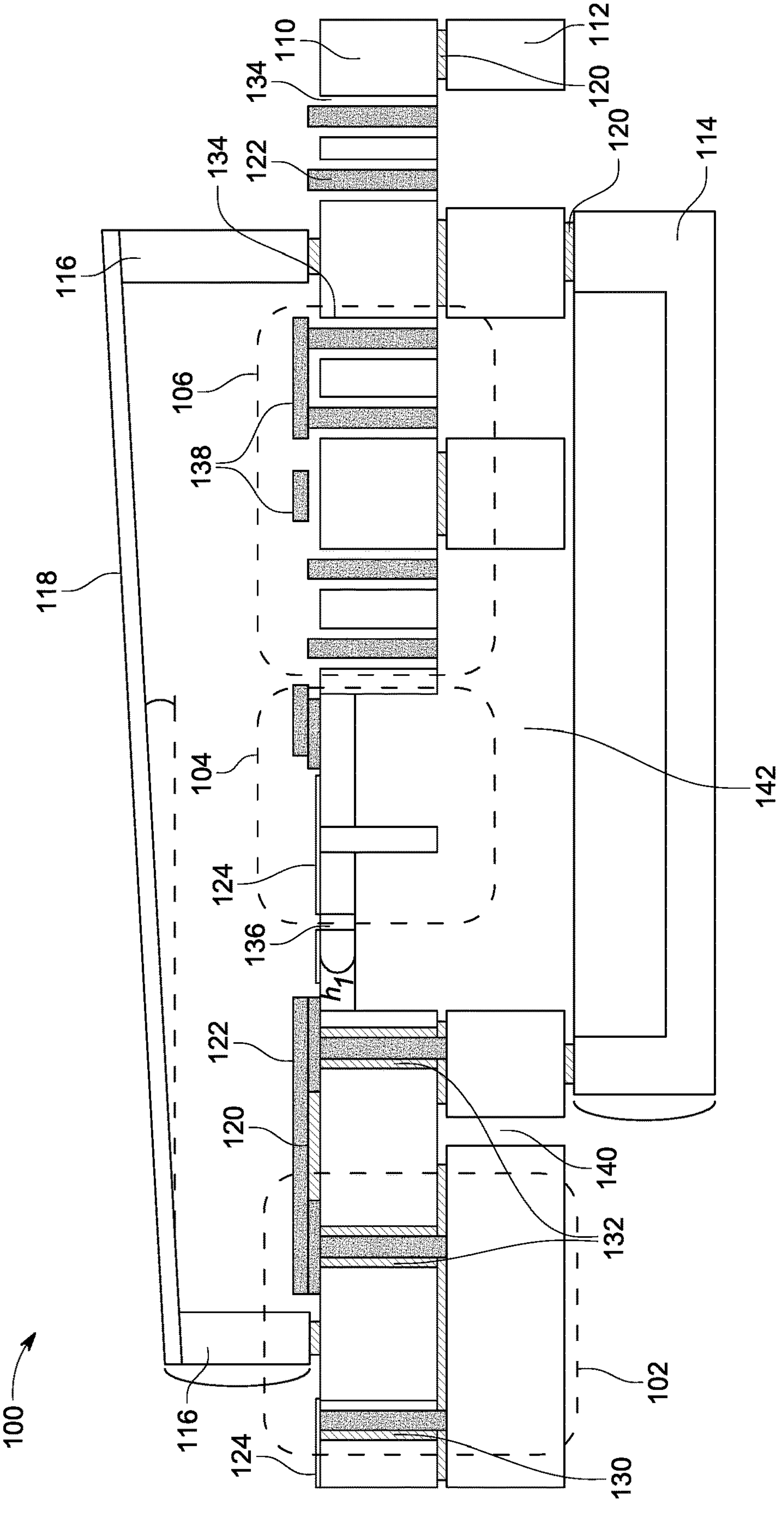
FIG. 1 is a cross-section view of a completed MEMS device with various example three dimensional structures produced by the example methods.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed toward fabrication processes for producing a MEMS device that allows for released structures with complex topologies. The process involves etching trenches, providing oxide coatings, formation of polysilicon structures, and selective etching away of the oxide coatings to produce released structures with well-defined features. The process also allows for structures with engineered stiffness distribution for optimal strength/mass ratio. The process also allows for electrically isolated MEMS structures.

FIG. 1 shows a cross section of a MEMS device 100 with different MEMs structures 102, 104 and 106. In this example, the MEMS device 100 may be an angled mirror for a LIDAR based system with structures such as actuators to position the mirror and other releasable devices and structures. In this example, the structure 102 is an isolated structure that contains electrical feedthroughs in and out of a hermetically sealed, 0-level package. The structure 104 is a released structure with corrugation, which provides mixtures of high and low aspect ratios for the mechanical structure, therefore enabling customized stiffness/inertia ratios for the proof mass and maximum strength mass ratio. For example, the structure 104 may be a set of anchors and latches that allow the positioning of different releasable structures after fabrication. The structure 106 may be a comb drive actuator that may have highly uniform surfaces for maximizing capacitance. The structure 106 may also have co-existing tall/thin and flat/thin structures that are preferred for comb drive actuators.

The device 100 includes a silicon on insulator device layer 110, a silicon on insulator handle layer 112, a bottom spacer layer 114, a top spacer layer 116, and a clear lid 118. The moveable structures such as the structure 104 and structure 106 are anchored on the handle layer 112. The various layers in the released structures 104 and 106 are formed from single crystal silicon from the device layer 110. Different layers of silicon oxide 120, polycrystalline silicon 122, and metallic coating layer 124 are formed through deposition and growth from processing of the wafers that form the device layer 110 and the handle layer 112 as will be described below. The structures 102, 104, and 106 thus are a combination of the single crystalline device layer 110, silicon oxide 120, polycrystalline silicon 122, and metallic coating layer 124.

Example features may be seen in the device 100. As may be seen in FIG. 1, the device layer 110 may have areas with a relatively thinner height of 10-20 μm and a relatively thicker height of 100-200 μm. In this example the releasable structures formed from the device layer 110 may then have one of the two heights. Of course other heights may be formed from etching away areas of the device layer 110. In this example, structural areas with the smaller height have large surface areas with low mass, e.g., large mirrors. Structural areas with the larger height reinforce mechanical strength by forming thin backbones to the otherwise thin flat structures. The handle layer 112 is etched through in select areas to allow for more space for the movement of movable structures.

As will be explained, the released structures may have complex topologies through the processes described below. The released structures with a high aspect ratio may be fabricated in both silicon and polysilicon. Released structures with a very low aspect ratio may be fabricated of polysilicon. The process may produce released structures having a low aspect ratio in silicon for large, flat structures such as mirrors etc. The process allows engineered stiffness distribution for optimal strength/mass ratio in a structure. The device 100 allows low temperature, hermetically sealed package solution with feedthroughs to the isolated devices. The device 100 has a wafer level vacuum capable seal. The device 100 also has a 0-level hermetic seal with angled viewport. The device 100 has in-plane isolation with multiple electrical potentials and electrical feedthrough without interfering with the hermetic seal of the devices by the lid and cap layers.

There are a number of structural features in the device 100. A deep conductive trench 130 is etched through the entire thickness of the device layer 110 to allow conduction of electrical signals. Another set of deep conductive trenches 132 allows conduction of signals between polysilicon features. In this example, the deep trenches 130 and 132 are coated with silicon oxide and filled with polycrystalline silicon and may thus be used to isolate structures defined by the trenches 130 and 132 and conduct signals through the vias that are formed from the trenches 130 and 132. Other deep trenches 134 may be provided to allow for fabrication of polysilicon support structures within the trenches 134. Shallow trenches 136 may be etched through a thinner section of the device layer 110. The shallow trenches 136 may be used to define released structures such as the structure 104.

As explained above, relatively tall polysilicon structures, together with the surrounding single crystal silicon structure, may be released of the entire thickness of the device layer 110 may be released and form high aspect ratio, narrow gap comb structures. Such structures may include a polysilicon bridge 138 on top of the surface of the device layer 110. The bridge structures may be supported within the trenches 134. The structures may also include released structures formed by a cutout 140 with a mixture of high and low aspect ratio features to help achieve large, flat, stiff and light weight objects such as a mirror. Thin polysilicon may also be released as shown in a general area 142. The thin polysilicon form a part of a capacitive based drive device or a capacitive based sensor device with electrical interconnects formed in the general area 142.

Figure 2A:
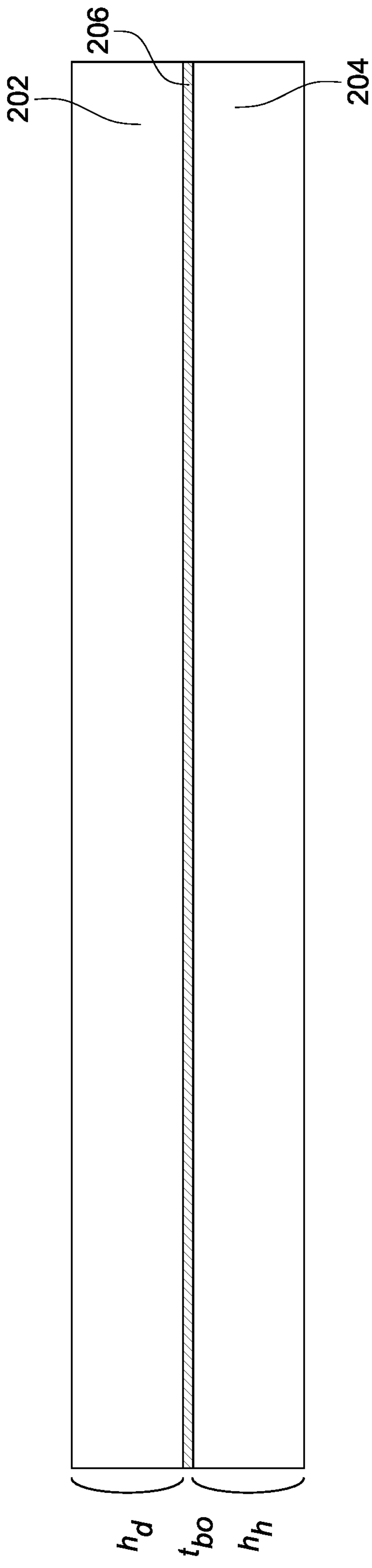
FIGS. 2A-2L are a series of processing diagrams for fabricating the device and handle layers of the system in FIG. 1.

FIGS. 2A-2L show the example fabrication process to produce the MEMS device 100. In FIG. 2A, the process begins with fabricating a device wafer 202 and a handle wafer 204 that form the respective device layer 110 and handle layer 112. A buried oxide layer 206 is formed between the device wafer 202 and the handle wafer 204. There is no requirement for the thickness ($t_{box}$) of the buried oxide (BOX) layer 206. In this example, the device wafer 202 is typically 100-300 μm thick ($h_d$) and has a doping level sufficiently high to reduce resistance in the silicon which may negatively impact final device speed. Of course other crystalline materials such as GaAs, InP, and SiC that achieve the same/similar topologies may be used for either of the wafers 202 and 204. There is no requirement on thickness ($h_h$) for the handle wafer 204. Moderate to high doping levels are preferred since part of the handle wafer 204 with be used to direct signals out of the package with through wafer vias.

Figure 2B:
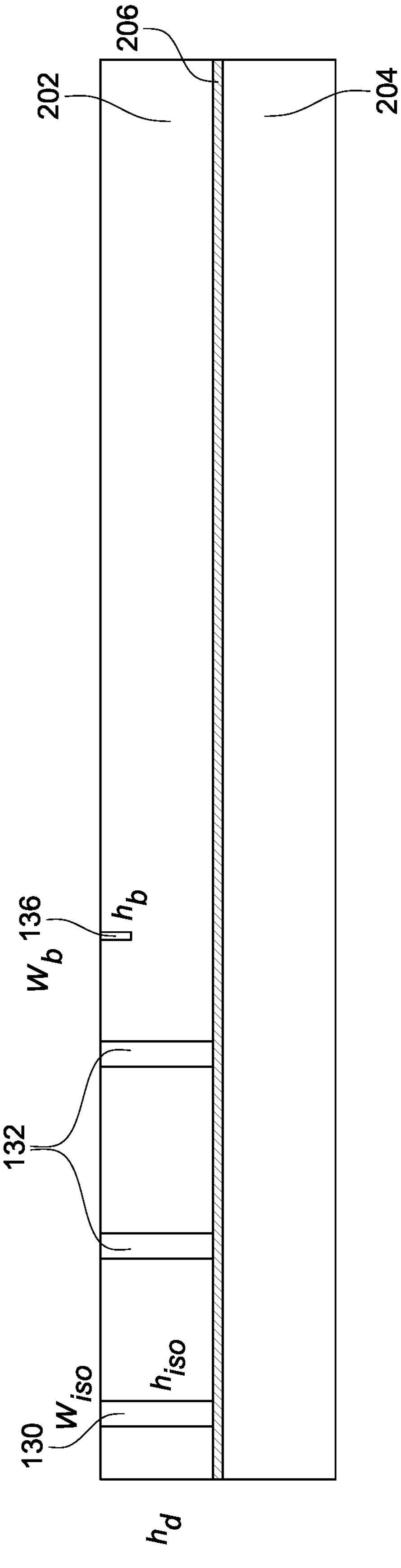

FIG. 2B shows initial etching of two types of trenches in the device wafer layer 202. In this example, the deep isolated trenches 130 are etched through the thickness of the device wafer 202. Thus, the deep isolated trenches (width: $w_{iso}$, depth: $h_{iso}=h_d$) that go through the entire thickness of the device layer 110. The shallow "breakup" trenches such as the trench 136 (width: $w_b$, depth: $h_b<<h_d$) are much shallower than the device layer thickness due to loading effect. The shallow trench will later be used to either add a break or to provide in plane electrical isolation for the thin feature. The breakup trenches are used to physically break up movable structures in shallow areas (depth $h_1$). Through wafer vias have the same width and depth as the isolated trenches 130. In this example, typical values for the isolated trenches are $w_{iso}$~5-10 μm; and $w_b$~0.5-2 μm. The through trenches 132 may be ignored if other means of packaging are used such as deposited conductive layers which go in and out of a sealed cavity underneath the capping structure.

Figure 2C:
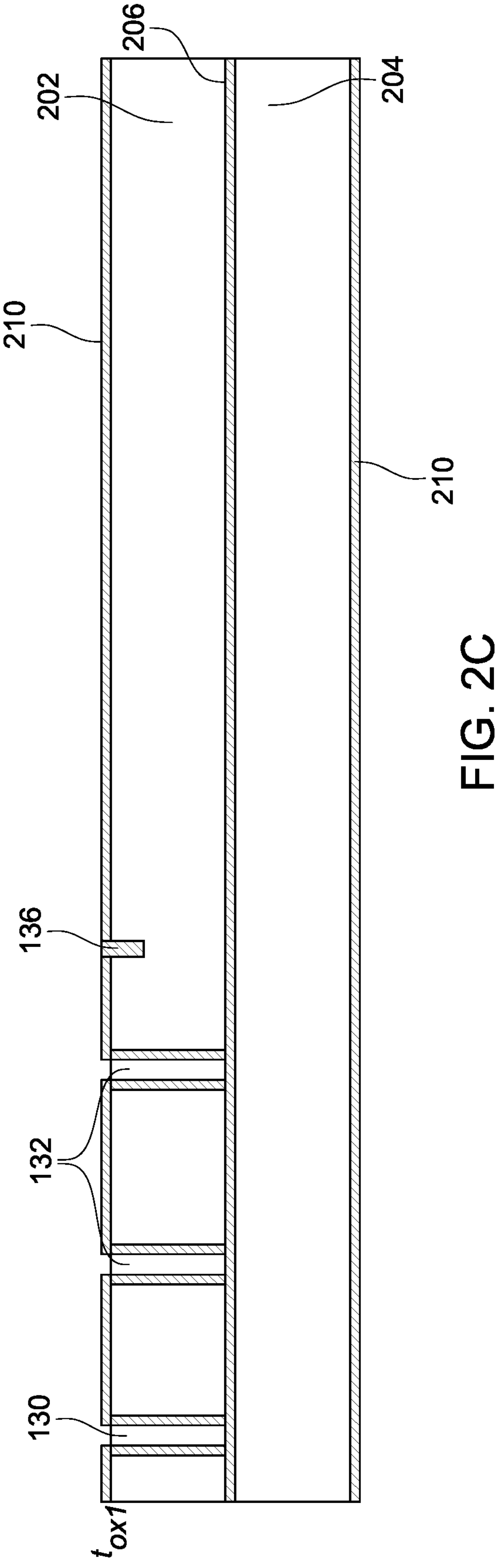

FIG. 2C shows the growth of a first silicon oxide layer 210 on the exposed surfaces of the device wafer 202 and the handle wafer 204. The first silicon oxide layer 210 coats the sides of the trenches 130 and 132 and fills the isolation trench 136. In this example, the narrower isolation trench 136 is completely filled with oxide at a thickness, $t_{ox1}$>~0.88*$w_b$~0.44-1.0 μm. Wider trenches such as the trenches 130 and 132 are lined with a thin layer of oxide of the thickness $t_{ox1}$.

Figure 2D:
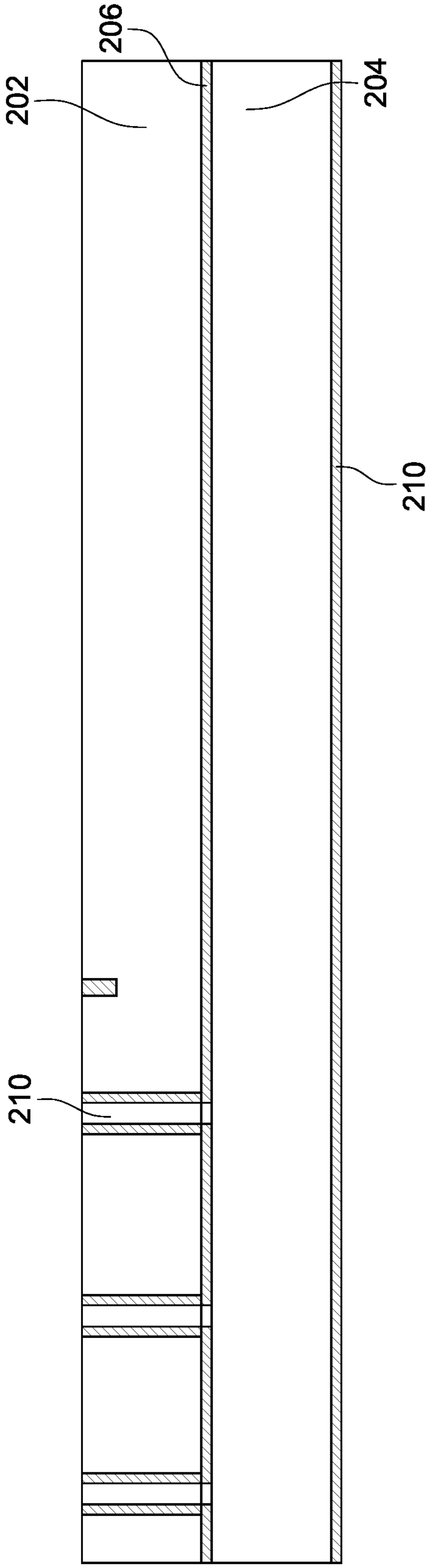

FIG. 2D shows the results of etching away the first silicon oxide layer 210 on the surface of the device wafer 202 to allow access to the trenches 130 and 132. The etching may be performed using a mask. This step may be ignored if through-wafer vias are not needed. Over-etching may be needed to ensure clearance of the silicon oxide at the bottom of the deep trenches such as trenches 130 and 132.

Figure 2E:
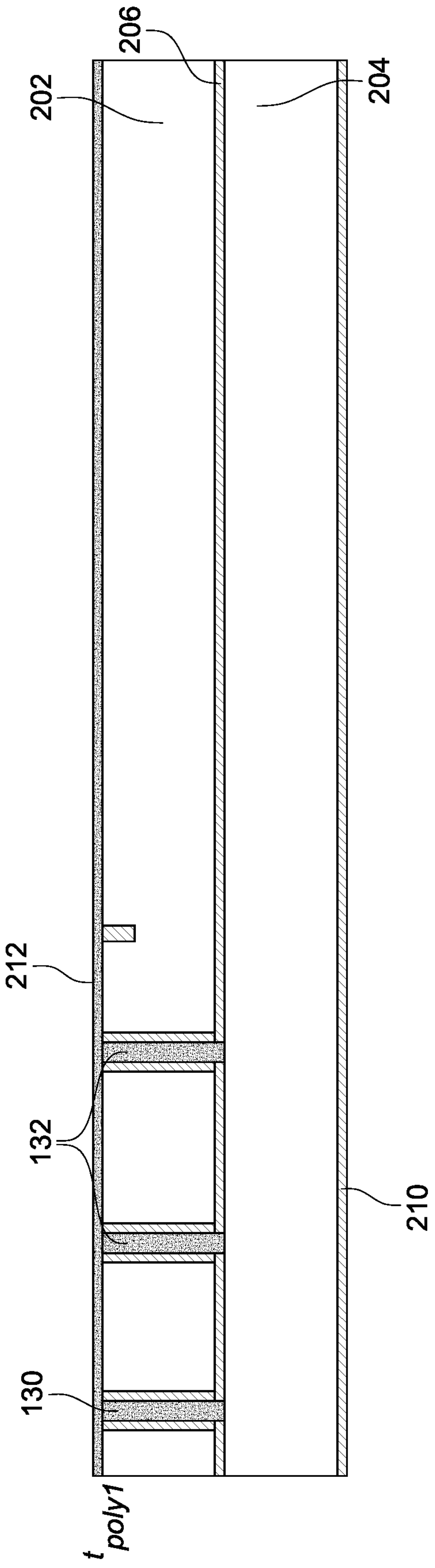

FIG. 2E shows the deposition of a first layer of polysilicon 212 on the surface of the device wafer 202. As shown in FIG. 2E, the polysilicon 212 fills the gaps in the trenches 130 and 132. The polysilicon layer 212 needs to be thick enough to fill all of the trenches 130 and 132 to serve as a conductive conduit. Thus, $t_{poly1}$>~0.5*$w_{iso}$ in this example. A short ion mill step may be used prior to polysilicon deposition to ensure better electrical contact between the polysilicon plugs and the surfaces of the handle wafer 204. The polysilicon layer 212 needs to highly doped (e.g., doping level is greater than 1E17-20/$cm^3$ or higher) for vias formed through the device wafer 202. Such doping requirements are not needed for trench isolation purposes.

Figure 2F:
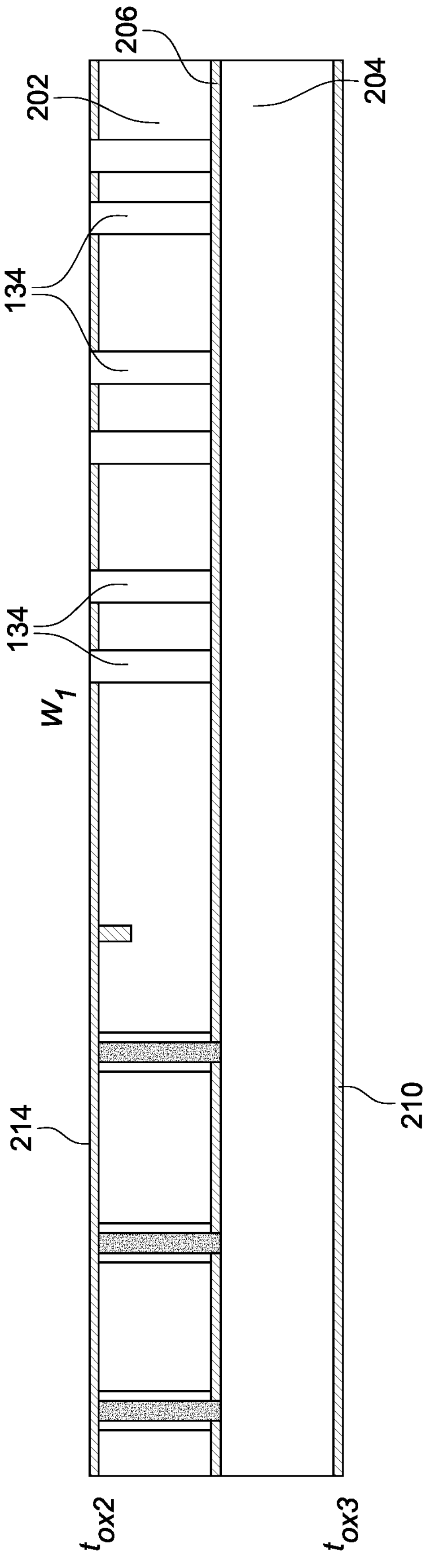

FIG. 2F shows a second layer of oxide 214 that is grown after the polysilicon layer 212 is etched away to the device wafer 202. The oxide layer 214 is grown to increase the thickness of the previous oxide layer 210 on the handle wafer 204. After the oxide layer 214 is grown, the other deep trenches 134 are etched into the device wafer 202 to the buried oxide layer 206. These trenches 134 define areas on the surface of the device wafer 202 that will form released structures such as a comb drive or a sensor. In this example, the oxide layer 214 needs to be thick enough to serve as mask for etching through entire device wafer 202. In this example, the widths of the trenches 134 ($w_1$) are kept the same and a consistent density everywhere on the device wafer 202 to maximize etch uniformity and profile control. In this example, the width of the trenches 134 ($w_1$) is between 5-10 μm. The thickness of the oxide layer 210 ($t_{ox3}$) on the backside of the handle wafer 204 continues to grow and is thicker than the thickness of the second oxide layer 214 ($t_{ox2}$).

Figure 2G:
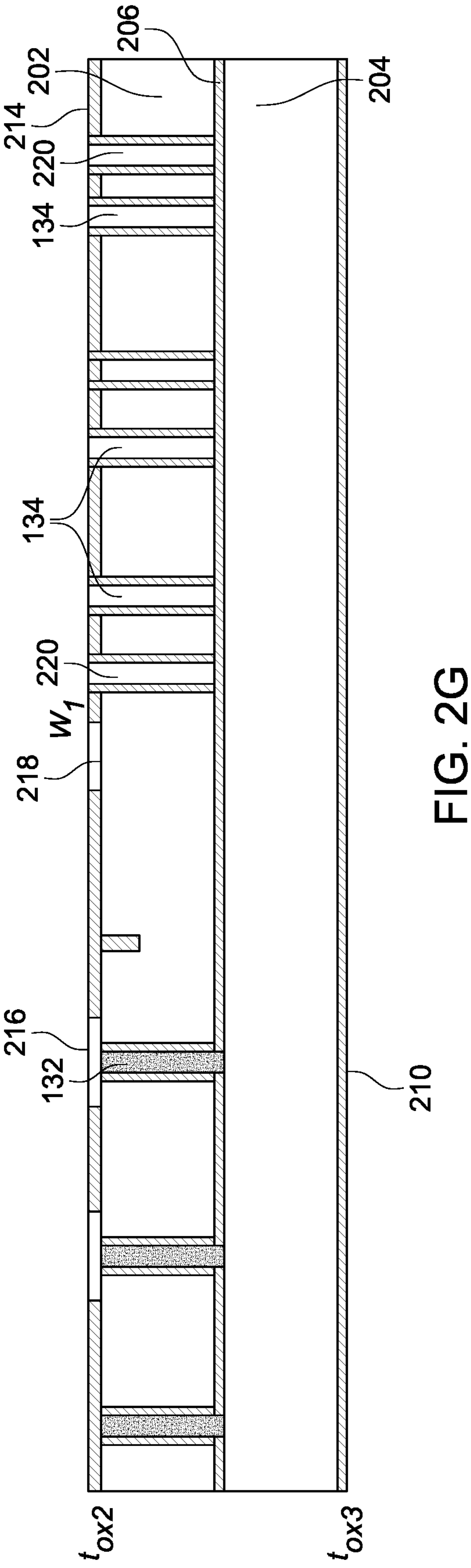

FIG. 2G shows that the second oxide layer 214 continues to be grown to coat the sides of the trenches 134. A mask allows lithographic etching the second oxide layer 214 away in certain areas 216 to form open windows that allow access to the trenches 132. The mask also allows other openings in certain areas 218 for structures on the device wafer 202. The mask also allows other openings in certain areas 220 for access to the trenches 134. Electrical connections between the silicon and polysilicon can be subsequently deposited.

Figure 2H:
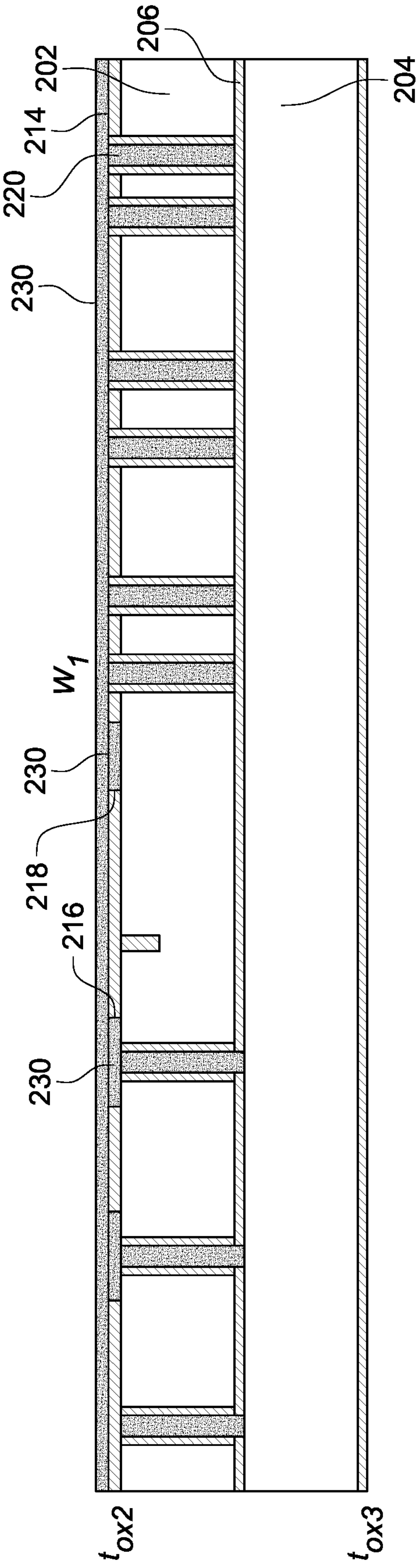

FIG. 2H shows the deposition of a second polysilicon layer 230. The polysilicon layer 230 fills the areas 216 formed in the second oxide layer 214 to the trenches 132. The oxide openings in areas 216 on vias such as the trenches 132 enable electrical connection to the vias formed by the trenches 132. Oxide openings 218 on the silicon oxide layer 214 allows formation of polysilicon structures via the polysilicon layer 230. The oxide openings 220 over the trenches 134 provide access to form anchors for polysilicon structures in the trenches 134 formed by the polysilicon layer 230.

Figure 2I:
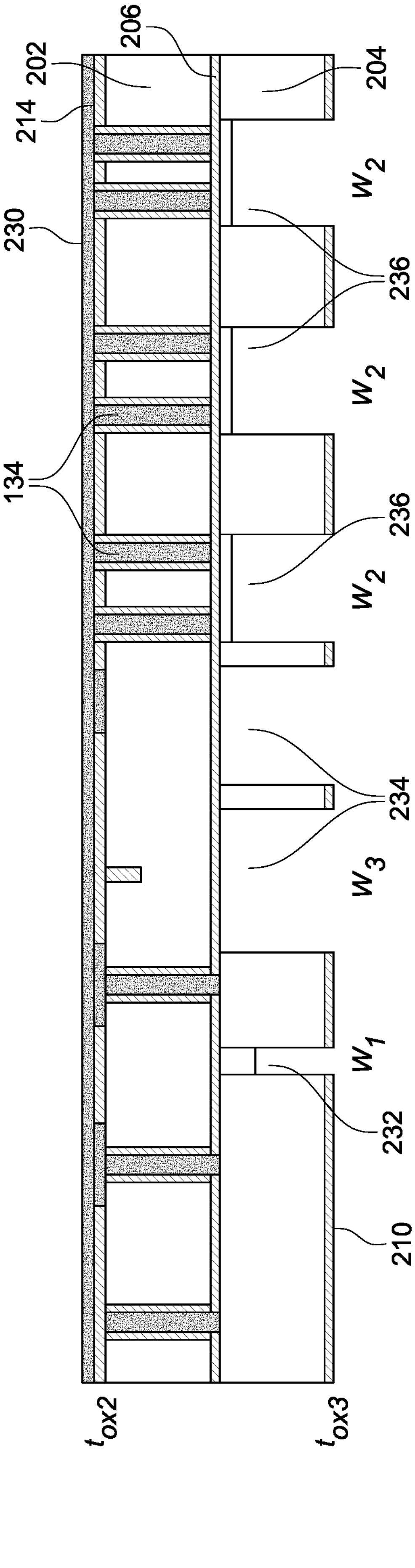

FIG. 2I shows the process of etching away of areas from the bottom side of the handle wafer 204. The areas may be etched through the oxide layer 210 at the bottom of the handle wafer 204. A first trench 232 is etched to a specific depth into the handle wafer 204. The buried oxide layer 206 prevents etching into the silicon of the device wafer 202 locally. Deeper etches may be provided in areas 234 that will eventually etch away the buried oxide layer 206 and parts of the device wafer 202 until the desired thickness, h1, of the thin polysilicon structure in the general area 142 in FIG. 1 is reached. Other areas 236 may be etched to a specific depth into the handle wafer 204 under the anchor structures formed in the trenches 134. A layer of photo resist may be deposited for patterning the polysilicon. The photoresist on the front side may be retained to minimize scratching. A mask is provided to direct the etching process to form the backside trenches 232, 234, and 236. The backside trenches 232, 234, and 236 may have different widths since the requirements on etch profile (e.g., verticality) are more relaxed compared to the front side. The narrowest trenches on the backside such as the trench 232 are designed to be completely filled with polysilicon and thus may have the same width as the trenches 130 and 132 on the device wafer 202. Because of the wideness of certain trench areas such as the areas 234 and 236, the etching reaches the buried oxide layer 206 much sooner than a narrow trench such as the trench 232. Correspondingly, the etching reaches the buried oxide layer 206 for the widest trenches 234 faster than the trenches 236. In this example, the middle-width trenches 236 are just wide enough (may be slightly less, greater or equal in width) to be compatible with features to be released in the device wafer 202 such as those formed in polysilicon in the trenches 134.

Figure 2J:
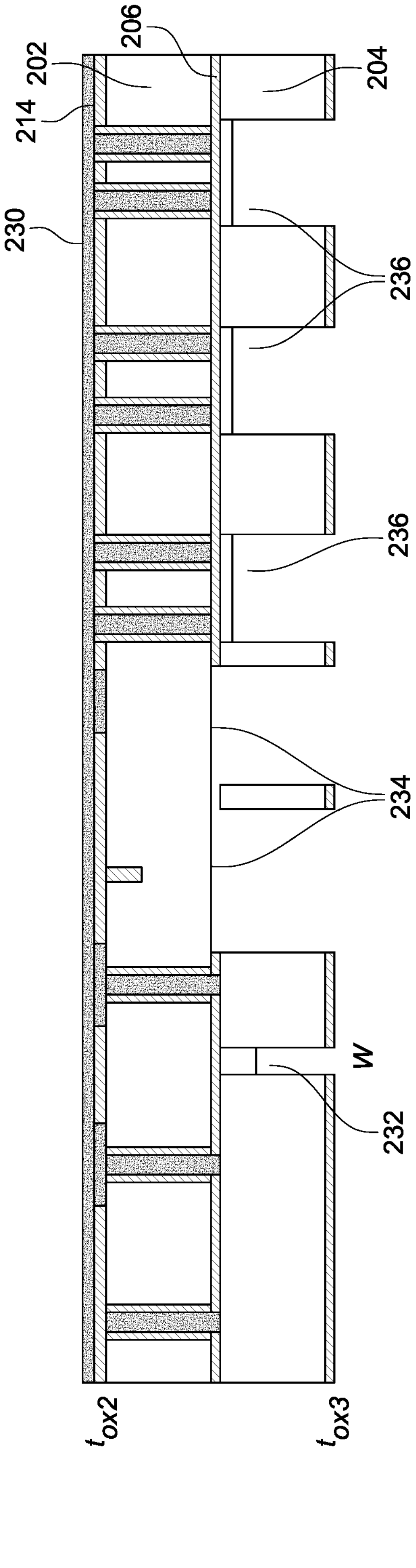

FIG. 2J shows the continued etching process from the backside of the handle wafer 204. As explained above, due to the wideness of the areas 234, the etching process etches away the buried oxide layer 206 in the areas 234. Silicon from the device wafer 202 remaining in the narrower trenches 232 and 236 prevents the buried oxide layer 206 from being etched away locally. The buried oxide layer 206 is ideally thinner than the thickness of the oxide layer 210 on the backside of the handle wafer 204.

Figure 2K:
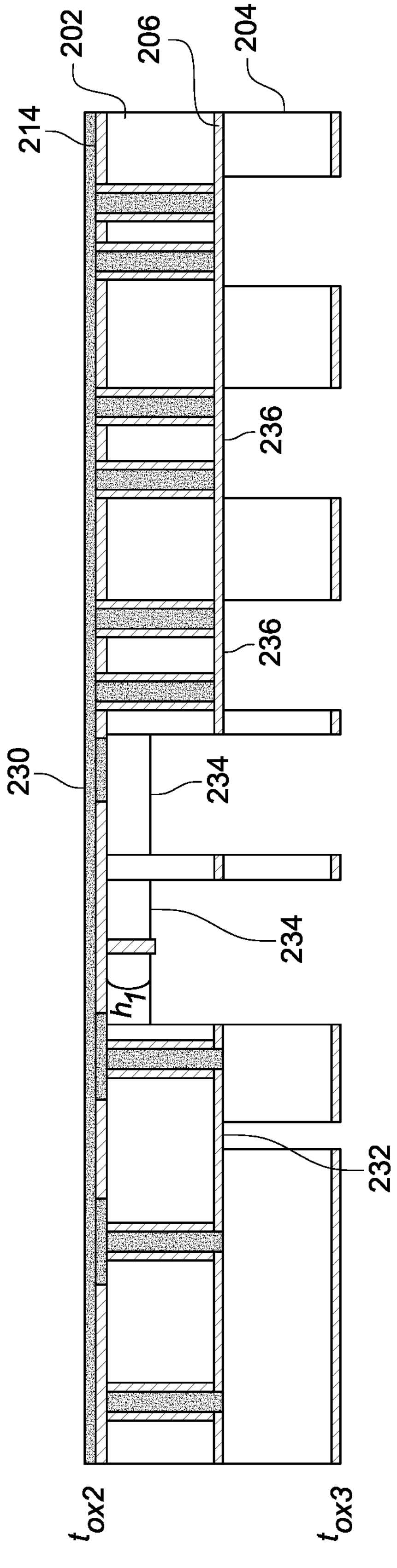

FIG. 2K shows the completion of the etching process. As may be seen the trenches 232 and 236 have been extended to the buried oxide layer 206. The etch in the areas 234 has completed etched away the buried oxide layer 206 and has etched away areas of the device wafer 202 to a desired height ($h_1$) in FIG. 1. The buried oxide layer has been entirely etched away in areas 234 thus extending the etch into the backside of the device layer thinning the remaining silicon. The width of the trenches 236 is designed to prevent the cracking of the buried oxide layer 206 during the etching process. Thus, the width of the trenches 236 is 10-20 μm in this example.

Figure 2L:
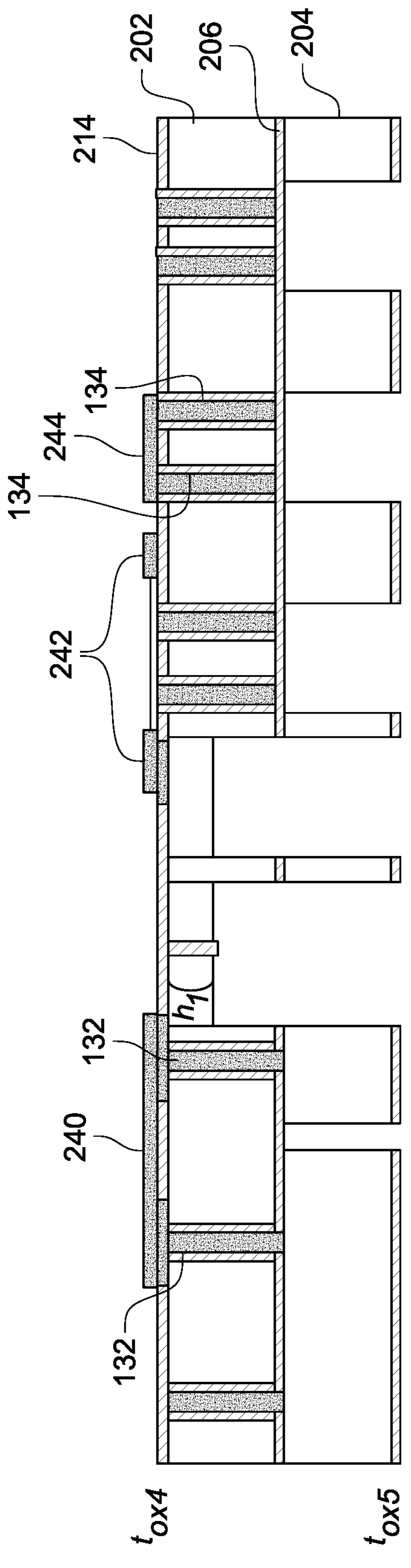

The polysilicon structures are then produced by applying photoresist through a mask for certain areas on the polysilicon layer 230. The polysilicon layer 230 is then etched away leaving polysilicon structures 240, 242, and 246 as shown in FIG. 2L. In this example, the structure 240 provide a connection between the polysilicon in the trenches 132. The structures 242 are formed on the oxide layer 214 to provide releasable structures. The structures 244 are attached to the polysilicon in the trenches 134 to form releasable anchor structures. The applied photoresist may be retained to prevent scratching of the front surface of the formed structures 240, 242, and 246. A short vapor hydrogen fluoride (VHF) etch may be run to release thin structures and clear oxide in open areas of the surface of the device wafer 202.

Figure 3A:
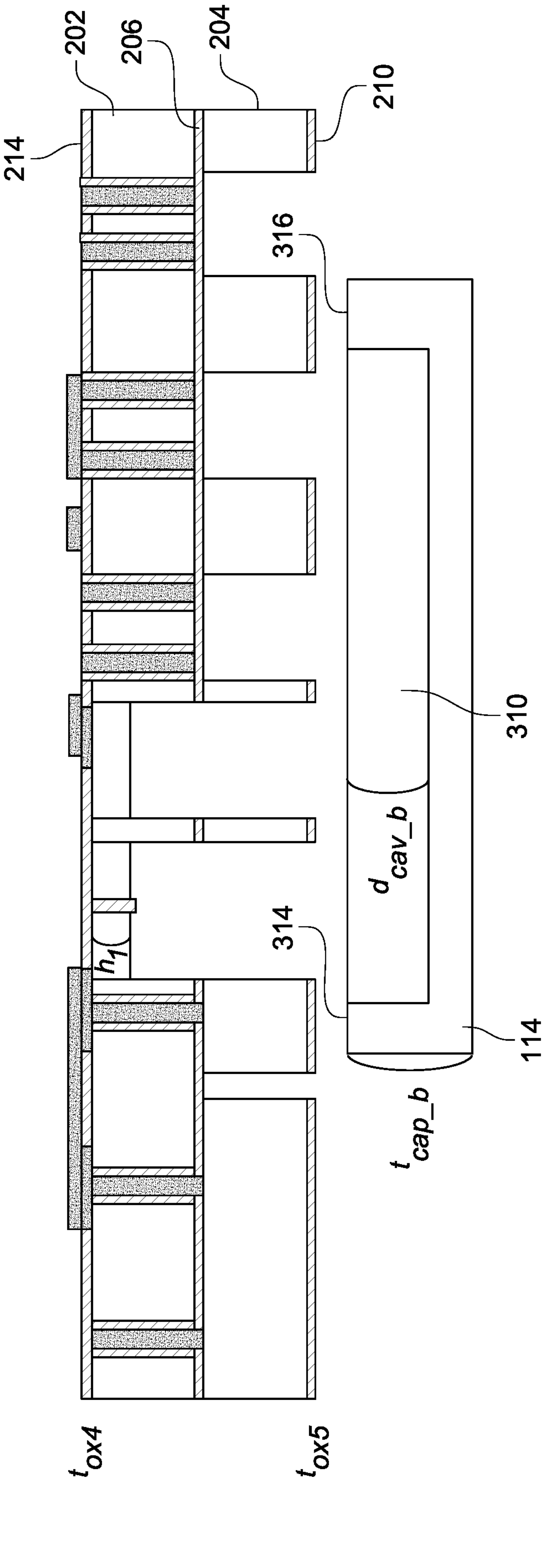
FIGS. 3A-3E are a series of processing diagrams for attaching the top and bottom cap layers to the assembled device and handle layers for the device in FIG. 1.
Figure 3B:
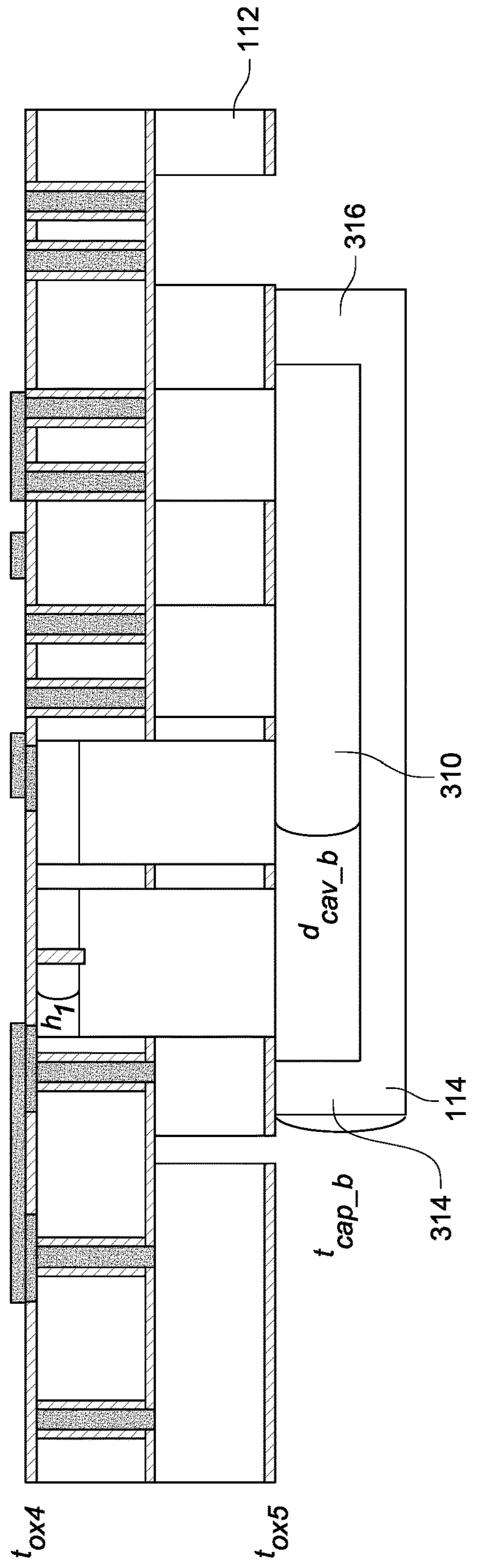
Figure 3C:
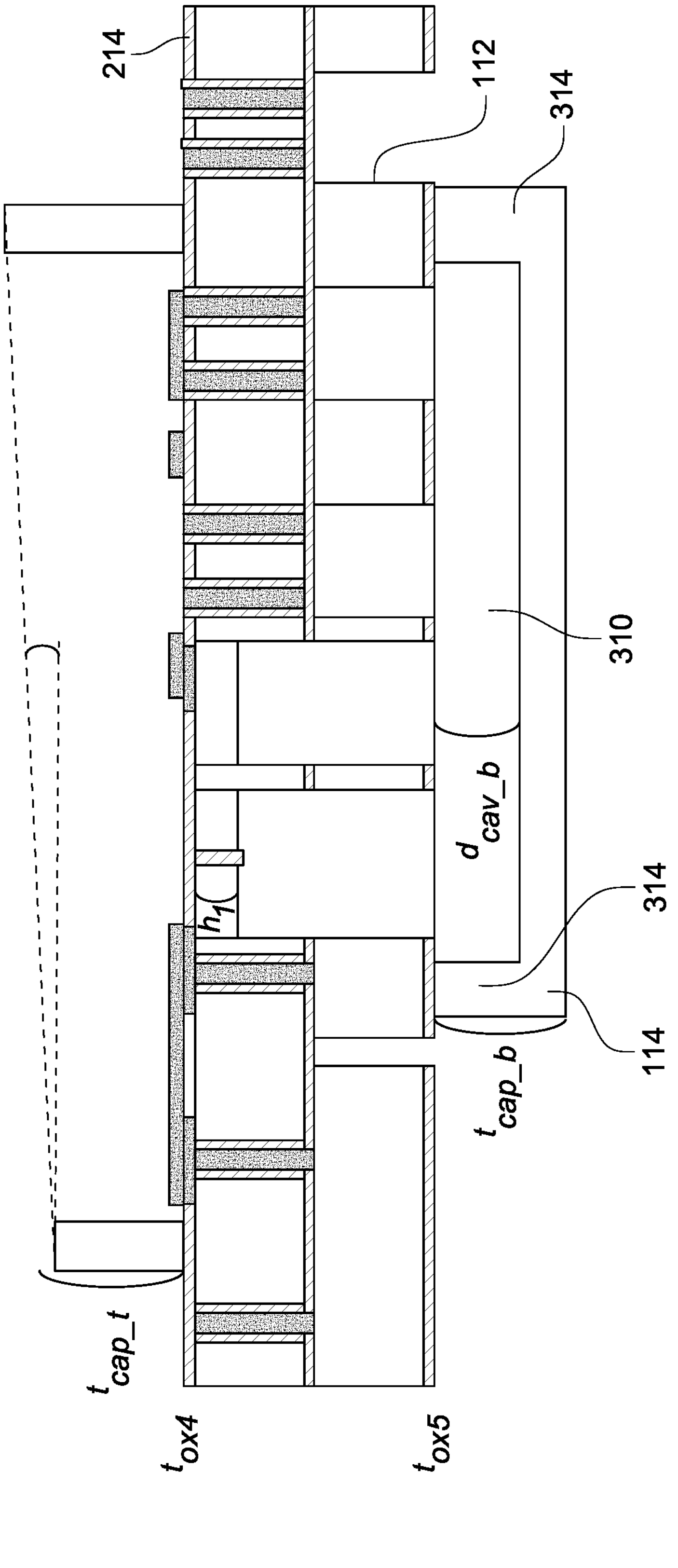

FIGS. 3A-3E show the process of attaching the bottom spacer layer 114, the top spacer layer 116, and the clear lid 118 in FIG. 1. The processing has been completed so the device wafer 202 has formed the device layer 110 and the handle wafer has formed the handle layer 112. FIG. 3A shows the bottom spacer layer 114 that includes a bottom cavity 310 that is etched to define supports 314 and 316. The supports 314 and 316 are attached to the bottom side of the handle wafer 204 as shown in FIG. 3B.

Many different bonding methods may be used to attach the bottom spacer layer 114 to the bottom side of the handle wafer 204. This may include fusion bonding, adhesive bonding, glass frit bonding, or eutectic bonding. A plasma process may be used to treat the bonding surfaces and enhance bonding strength and/or enable bonding at room temperature. For fusion bonding, an RCA/MOS clean is needed on surfaces of both the spacer layer 114 and the handle wafer 204 to prepare the bonding surfaces. Adhesive bonding requires deposition of adhesives on one of or both bonding surfaces. Glass frit bonding requires placement of a frit preform on one of the bonding surfaces. Eutectic bonding requires deposition of eutectics on one of or both bonding surfaces.

The oxide layer 210 on the backside of the handle wafer 204 may be removed first. Thin features may be released with either VHF etching or wet HF etching. The VHF etching step is controlled so that oxide layer 210 remains in areas where it is still needed. The only oxide exposed on the front are the areas under the seal ring. These areas are typically wide enough to survive the VHF etch. An RCA/MOS clean may be performed on the areas of the backside of the handle wafer 204 that will contact the supports 314 and 316 if fusion bonding is used. The bottom cap wafer thickness ($t_{cap\_b}$) is determined by the depth of the bottom cavity 310 ($d_{cav\_b}$). The etching to form the cavity 310 in the bottom cap wafer that forms the spacer layer 114 may be performed with either dry etch (as shown by the relatively straight sidewall above) or wet etch (e.g., potassium hydroxide (KOH) etching), which may result in a slanted sidewall profile. The bottom spacer layer 114 may have an oxide layer and may also go through an RCA/MOS clean as well if fusion bonding is used to join the bottom spacer layer 114 to the handle wafer 204.

The top spacer layer 116 is then prepared from a top cap wafer. The supports of the top spacer layer 116 may be prepared by a cavity etch in the top cap wafer. This may be done with either a dry etch (resulting in the relatively straight sidewall) or a wet etch (e.g., KOH), which may result in a slanted sidewall profile. The top cap layer may be shaped to provide supports at different heights for a tilted lid 118 in FIG. 1 or a flat lid.

Figure 3D:
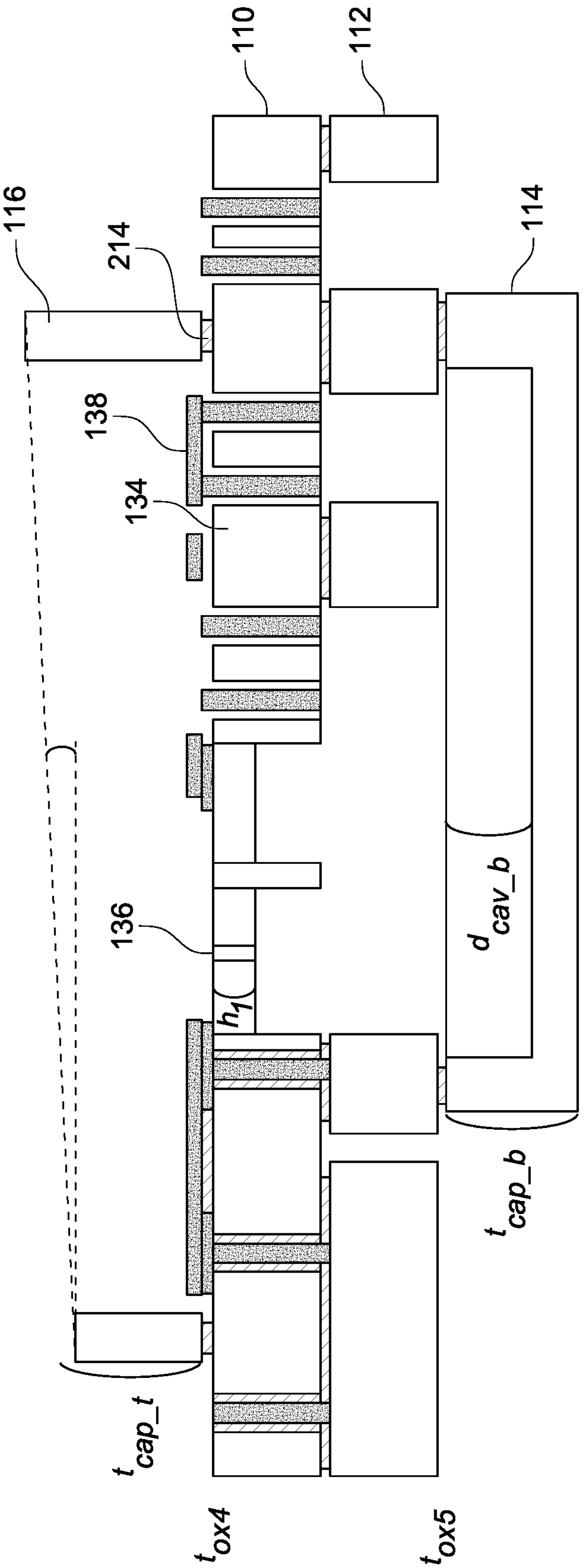

As shown in FIG. 3D, the oxide layer 214 on the frontside of the device layer 110 may be removed with either VHF or wet HF etch. The removal of the oxide layer 214 causes the trench 136 to define a releasable structure. The removal of the oxide layer 214 also eliminates the oxide layer on the sides of the trenches 134 thus creating the anchoring polysilicon structures and the bridge structure 138 in FIG. 1. In this example, a fusion bonding process is performed to attach the top spacer layer 116 to the frontside of the device layer 110. Of course any of the other bonding methods described above may also be used. For the fusion bonding, an RCA/MOS clean is performed on the contact surfaces. The top cap wafer thickness $t_{cap\_t}$ is determined by the depth of the top cavity $d_{cav\_t}$. The top cap wafer may have oxide on bonding surfaces with the device layer 110. The optional tilt angle, theta, determines the tile angle of the view port defined by the clear lid 118 be attached. Options in top cap wafer may affect the compatibility of subsequent wafer level sealing. If a non-flat option is used, view ports must then be individually attached to each device, instead of having the option of bonding an entire wafer of viewing glass with an AR coating and then separated by dicing.

Figure 3E:
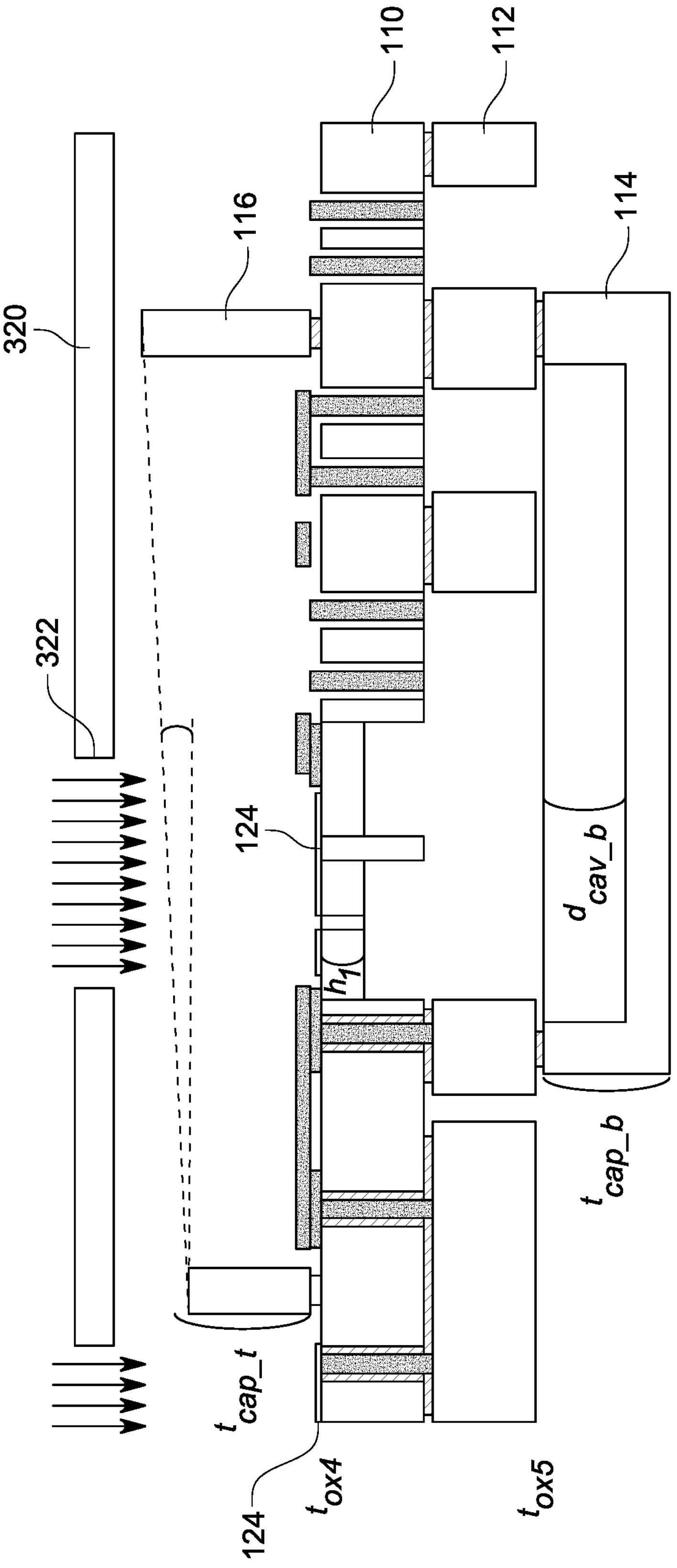

FIG. 3E shows the process of applying the metallic coating layer 124 to the front side of the device layer 110. A mask 320 is interposed over the device layer 110. The mask 320 includes apertures 322 that allow the deposition of metal to the corresponding areas on the front side of the device layer 110. After the metal layer is applied, the clear lid 118 is attached to the supports of the top spacer layer 116.

Figure 4A:
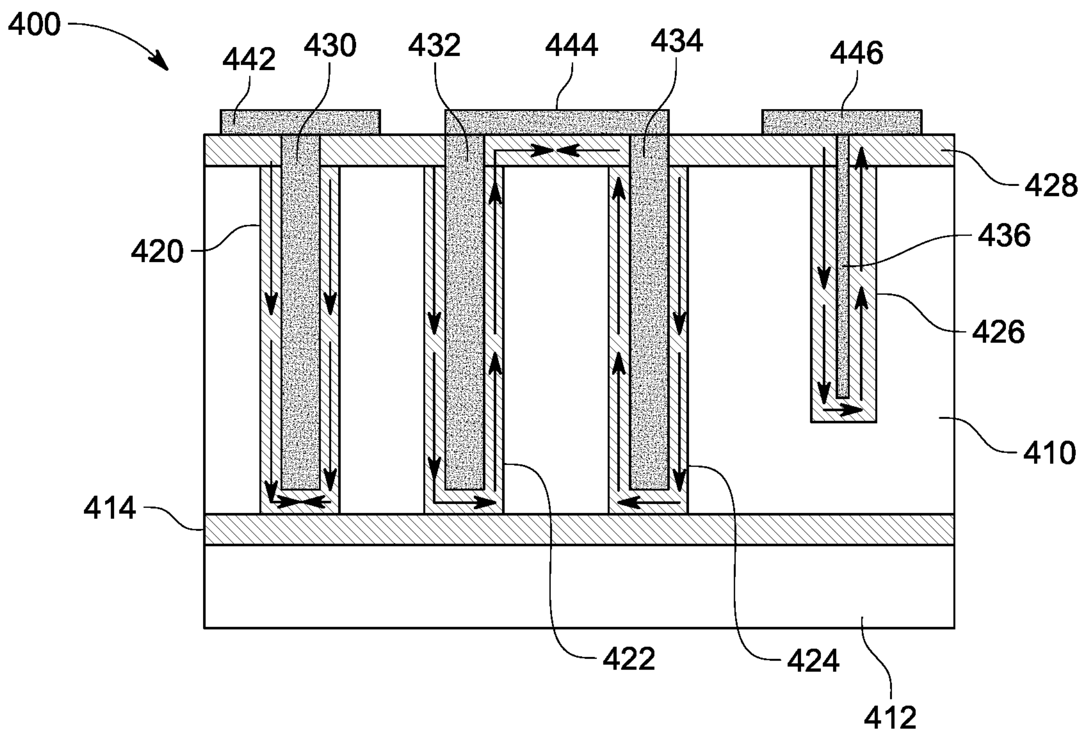
FIG. 4A is a side view of an example buried anchor structure that may be formed by the example process.

FIG. 4A is an example anchor structure 400 that may be formed from a device layer 410 and an anchor layer 412. A buried oxide layer 414 is formed between the device layer 410 and the anchor layer 414. Three deep vias 420, 422, and 424 are formed in the device layer 410 down to the buried oxide layer 414. A shallower via 426 is formed in the device layer 410. The sides of the vias 420, 422, 424, and 426 are coated with an oxide layer 428 during the fabrication process. Polysilicon structures 430, 432, 434, and 436 are located within the respective trenches 420, 422, 424, and 426. The polysilicon structures 430, 432, 434, and 436 are isolated via the oxide layer 428 during fabrication. A polysilicon contact pad 442 is formed on the polysilicon structure 430. A polysilicon bridge 444 is formed joining the polysilicon structures 432 and 434. Another polysilicon contact pad 446 is formed on the polysilicon structure 436. The polysilicon structures 430, 432, 434, and 436 may be released in the respective trenches 420, 422, 424, and 426 by etching away the oxide layer 428.

In this example, the polysilicon structures 430, 432, 434, and 436 serve as anchors to prevent unintended release. The release structures are stress-relief designs in the trenches 420, 422, 424, and 426. In this example, there are no openings underneath the device layer 410 and thus the connecting polysilicon structures such as the bridge 444 with a polysilicon patch help increase (more than double) the release length (minimum distance the release etch needs to work across to fully released structure).

Figure 4B:
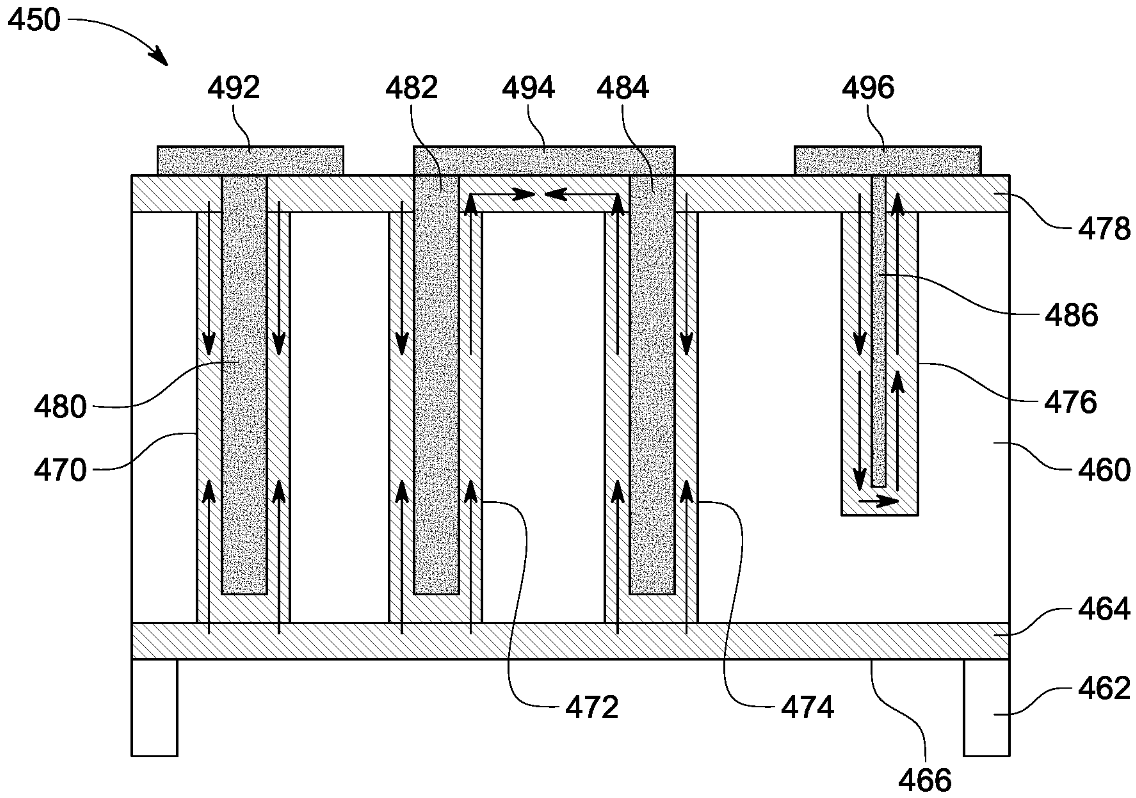
FIG. 4B is side view of another example buried anchor structure that may be formed by the example process.

FIG. 4B is another example anchor structure 450 that may be formed from a device layer 460 and an anchor layer 462. A buried oxide layer 464 is formed between the device layer 460 and the anchor layer 464. In this example, the area of the anchor layer 464 is etched away to create an opening space 466 that is defined by the bottom of the buried oxide layer 464. Three deep trenches 470, 472, and 474 are formed in the device layer 460 down to the buried oxide layer 464. A shallower trench 476 is formed in the device layer 460. The sides of the trenches 470, 472, 474, and 476 are coated with an oxide layer 478 during the fabrication of the structure 450. Polysilicon structures 480, 482, 484, and 486 are located within the respective vias defined by the trenches 470, 472, 474, and 476. The polysilicon structures 480, 482, 484, and 486 are isolated via the oxide layer 478. A polysilicon contact pad 492 is formed on the polysilicon structure 480. A polysilicon bridge 494 is formed joining the polysilicon structures 482 and 484. Another polysilicon contact pad 496 is formed on the polysilicon structure 486.

With the opening 466 underneath the device layer 460, releasable structures 480, 482, 484, and 486 remain stress resilient, but the release length is reduced by about 50% from the example in FIG. 4A. The release length for narrower trenches such as the trench 476 which do not reach the buried oxide layer 464 are unaffected by the presence of openings from underneath.

Figure 5A:
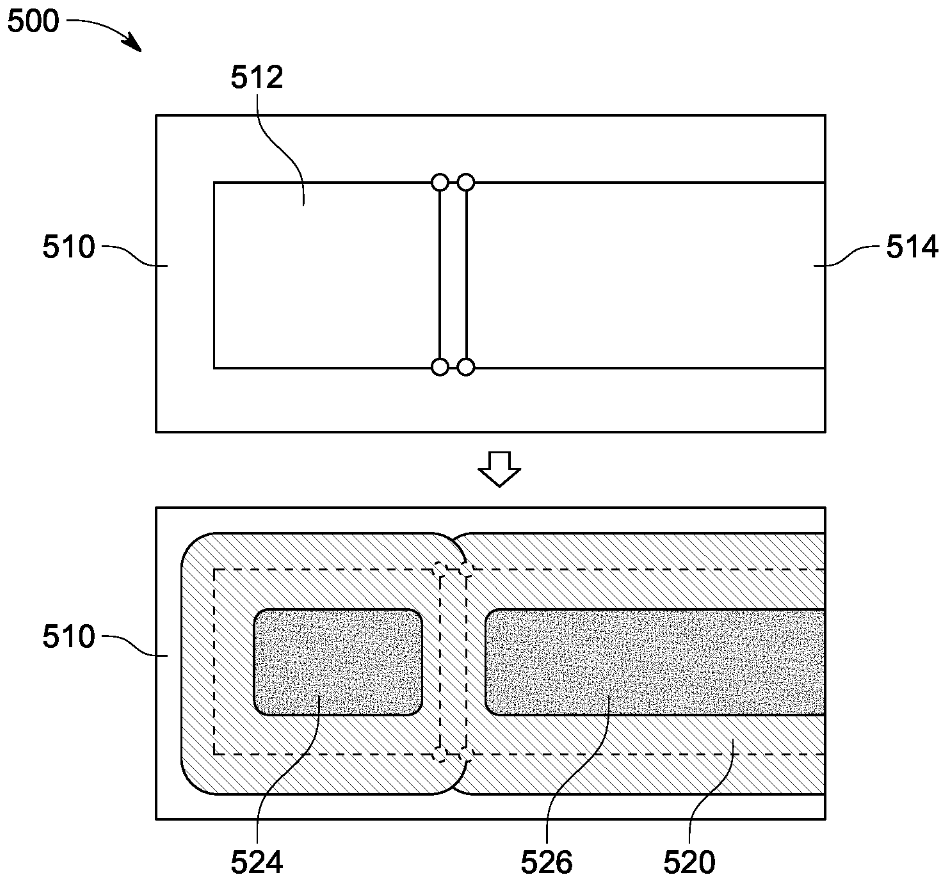
FIG. 5A is a side view of one example of fabricating features of silicon and polysilicon.

FIG. 5A is one example of a dummy structure 500 that is formed on a device layer 510 with two openings 512 and 514. The openings 512 and 514 may be formed in the device layer 510 by etching via a mask pattern. The openings 512 and 514 may be coated with an oxide layer 520. The remaining parts of the openings 512 and 514 may be filed with polysilicon to create the respective polysilicon structures 524 and 526. The polysilicon structures 524 and 526 may be released by etching away the oxide layer 520. Thus, the technique shown in FIG. 5A creates an larger empty gap at the end of the polysilicon structures 524 and 526 by the oxide layer 520. This is important for applications such as inplane actuators, where a large lateral motion is needed and not having enough space at the end of a polysilicon finger structure will physically limit its motion.

Figure 5B:
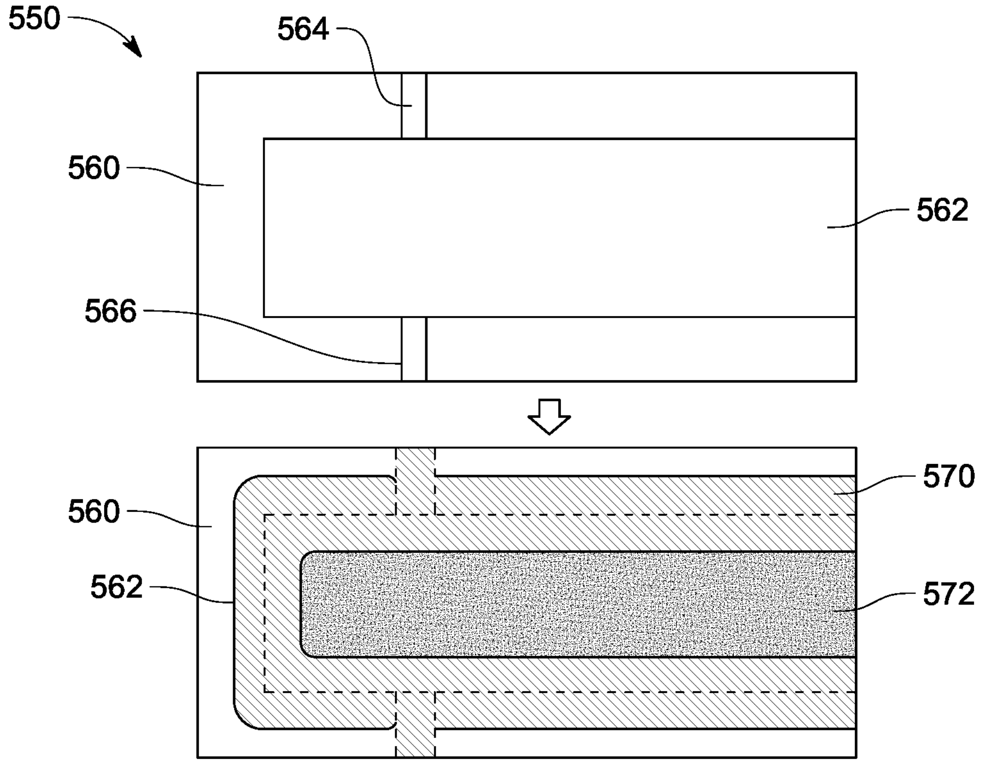
FIG. 5B is a side view of another example of fabricating features of silicon and polysilicon.

FIG. 5B is another example of a dummy structure 550 that is formed on a device layer 560. An opening 562 with two vias 564 and 566 are formed in the device layer 560. An oxide layer 570 is created through the vias 564 and 566 to line the surfaces of the opening 562. A polysilicon structure 572 is formed in the remaining space of the opening 562. The oxide layer 570 may then be etched away to release the structure 572. As shown in FIG. 5B, a portion of single crystal silicon material of the device layer 560 may be dropped as well to create an empty space at the end of single crystal silicon fingers created between polysilicon structures such as the structure 572. In this example, the polysilicon structure 572 is the polysilicon finger that is supposed to remain after the release process. The part of the device layer 560 between the vias 564 and 566 will be dropped after removal of the oxide layer 570 in the area. This allows more empty space for the movement of 570 in the horizontal direction.

Figure 5C:
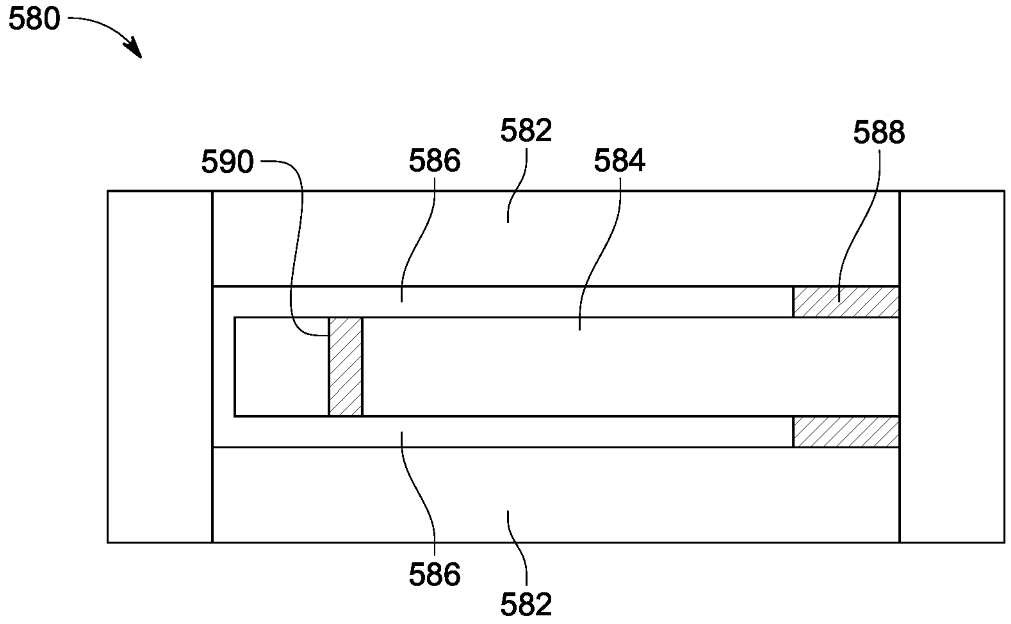
FIG. 5C is a side view of another example of fabricating features of silicon and polysilicon.

FIG. 5C shows an example process 580 of fabricating interlocking fingers or teeth as in an example comb driven actuator. In this example, gaps or trenches are formed in a silicon substrate 582. The remaining silicon between the trenches form fingers such as a finger 584. The trenches are coated with thermal oxide. The trenches are then filled with polysilicon to form interlacing fingers 586. The polysilicon only extends part of the way down the trench leaving a small gap 588 at the end of the trench. Correspondingly another gap 590 is created at the end of the finger 584. As shown in FIG. 5C, sacrificial blocks of polysilicon and single crystal silicon can be created, singulated, and dropped out of the structure by removing the oxide surrounding the sacrificial blocks. The oxide is then etched away through a process such as VHF.

Figure 6A:
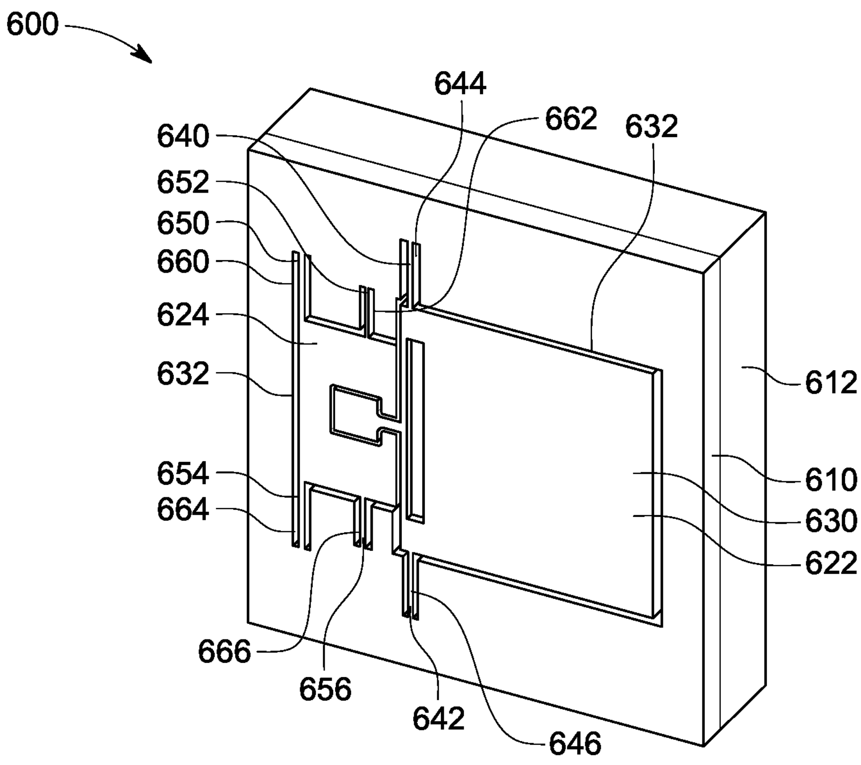
FIG. 6A is an isolated front perspective view of an example MEMS device with a moveable structure and an anchor structure.
Figure 6B:
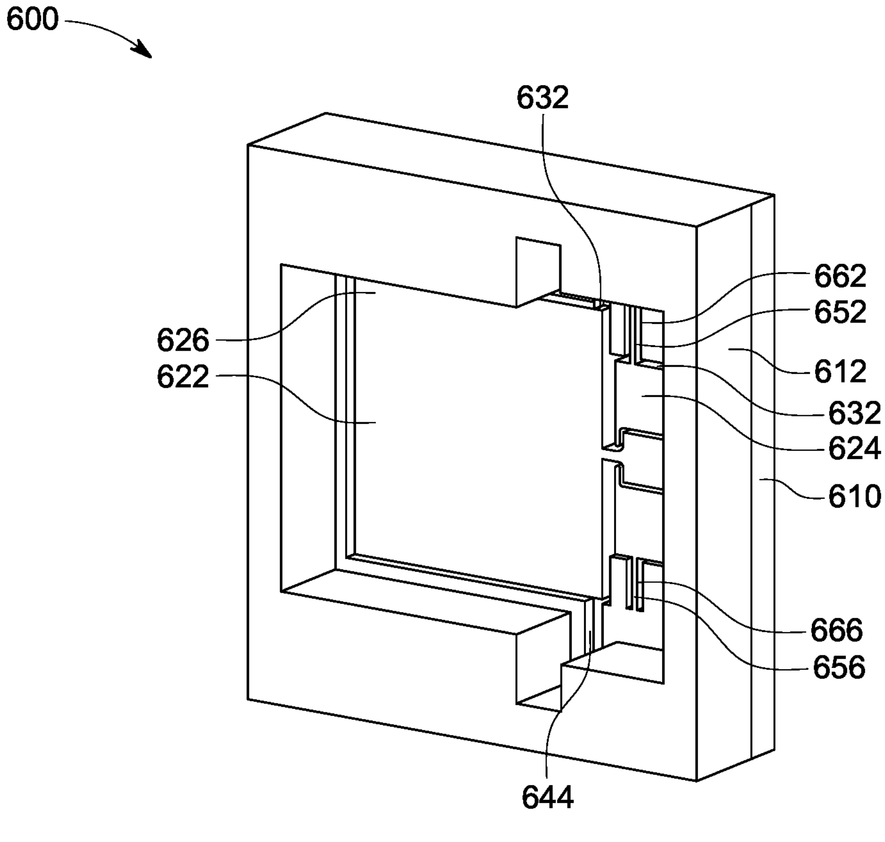
FIG. 6B is an isolated back perspective view of an example MEMS device with the moveable structure and anchor structure.

FIG. 6A is a front isolated perspective view of an example micro-electromechanical system (MEMS) device 600 fabricated that includes two devices similar to the structure 104 and the structure 106. FIG. 6B is a back perspective view of the example MEMS device 600. The MEMS device 600 includes a device layer 610 and a handle layer 612. A moveable device structure 622 is supported by the device layer 610. The device structure 622 is created by the fabrication process outlined above from the device wafer that forms the device layer 610. A moveable anchor structure 624 is supported on the device layer 610 in proximity to the device structure 622. In this example, the device structure 622 is fabricated in a manner of the example structure 104 in FIG. 1 while the anchor structure 624 is fabricated in a manner of the example structure 106 in FIG. 1. A cavity 626 is formed below the device structures 622 and 624.

The device layer 610 has a top surface 630 and an opposite bottom surface that is created in a process similar to that described above to etch away the handle layer 612. The cavity 626 in conjunction with trenches 632 cut around the device structure 622 and anchor structure 624 in the device layer 610 allows movement of the device structure 622 and the anchor structure 624 as these structures are released from the device layer 610 during the fabrication process.

In this example, the device structure 622 is a mirror having a reflective layer that may be the metallic coating layer 124 in FIG. 1 formed on the top surface 630. The released device structure 622 is a mirror that is deployed at an offset angle that may be used in optical applications such as LiDAR. In this example the mirror on the moveable device structure 622 is part of a light detection and ranging (LiDAR) beam steering apparatus formed as part of the device layer 610.

The moveable device structure 622 is attached to the device layer 610 via two torsion structures 640 and 642. The torsion structures 640 and 642 are formed in wide trenches 644 and 646 formed in the device layer 610 by the process explained above. In this example, the torsion structures 640 and 642 act as torsion springs to allow the device structure 622 to be rotated on an axis parallel to the torsion structures 640 and 642.

The anchor structure 624 includes opposite sides that each support a respective pair of in plane flexure members 650, 652, 654, and 656. Each of the flexure members 650, 652, 654, and 656 are connected to the device layer 610 at the ends of respective trenches 660, 662, 664, and 666. The flexure members 650, 652, 654, and 656 are fabricated in the respective trenches 660, 662, 664, and 666 by the techniques explained above. Thus, the anchor structure 524 is released from the device layer 610 but remains connected by the flexure members 650, 652, 654, and 656. In this example, the flexure members 650, 652, 654, and 656 allow the movement of the anchor structure 624 in a motion away from the device structure 622. When the device structure 622 is rotated the anchor structure 624 is moved by the motion of the device structure 622. When the device structure 622 is moved to a desired angle at a deployment position, the anchor structure 624 is locked to the device structure 622 causing the device structure 622 to be locked into the desired angle.

Figure 7A:
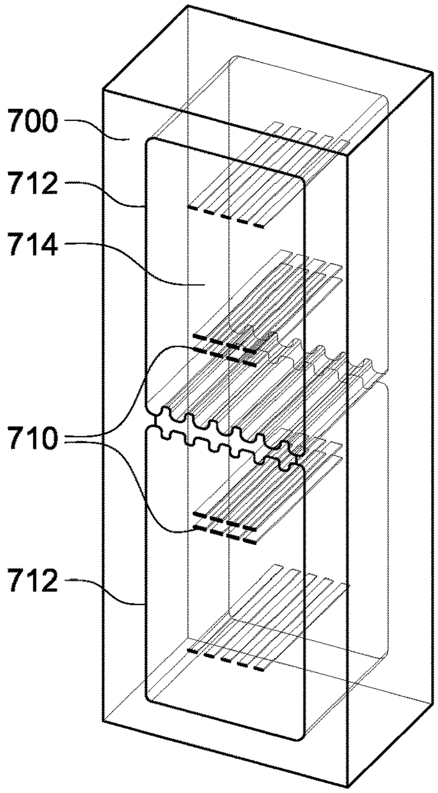
FIG. 7A-7G are a series of perspective views of the process of fabricating components of an example MEMS comb type actuator device and insolated MEMS devices.

Another application may be a comb based electrostatic actuator with features similar to the structure 106 in FIG. 1. The example actuator also has isolation features that may be produced from the example process. FIG. 7A shows the first step of the formation of two comb based actuators and isolated structures from a substrate 700. In this example, the substrate 700 may either be silicon on insulator (SOI) or silicon. In this example, the substrate 700 provides an etch stop and thus is silicon on insulator, which helps control the depth of the trenches and thus defines the structural height of the completed actuators.

A set of thin deep trenches 710 is first etched into the substrate 700. The isolation trenches 710 need to be narrow enough so that subsequent oxide deposition can planarize the top surface of the trenches 710. A series of border or sidewall isolation trenches 712 are formed to define future isolated actuator structures. The isolation trenches 712 need to be narrow enough so that subsequent oxide deposition can planarize the top surface of the substrate 700. In this example, the thin deep trenches 710 define the comb structure of the actuators. Either thermal oxidation or CVD oxide 714 may be used to fill trenches 710. CVD of the oxide is preferred since CVD provides a flatter top surface and only fills the top portion of trenches 710, making it easier to remove oxide in the trenches 710 later in the process.

Figure 7B:
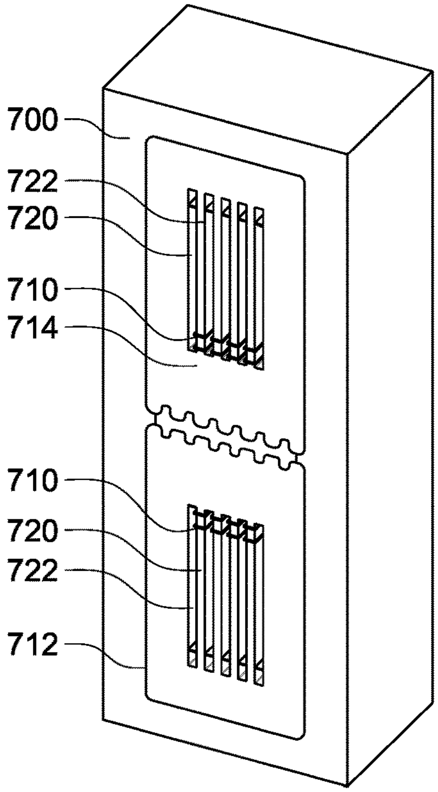

FIG. 7B shows the step of patterning the oxide 712 and then etching finger defining trenches 720 perpendicular to the trenches 710 filled with the oxide 714. The substrate between the trenches 720 form fingers 722 for the actuator. The presence of the oxide 714 in the isolation trenches 710 impacts the local loading effect and the trenches may become shallower.

Figure 7C:
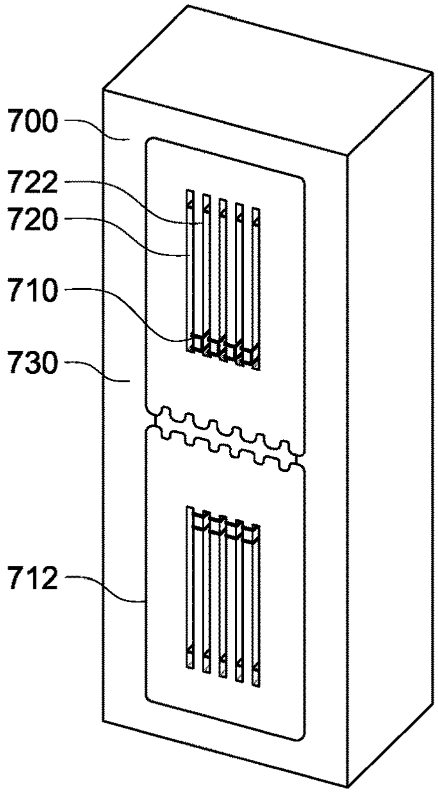

FIG. 7C shows the result of oxidizing all exposed surfaces. An optional step may be to remove the top surface oxide prior to oxidizing the exposed surfaces. An oxide layer 730 is formed on the top surface of the substrate 700 and the sides of the trenches 720. The oxidation process may be performed via wet oxide or dry oxide. Wet oxide produces faster, thicker, and still highly uniform oxide from the top to the bottom of trenches. Dry oxide is used for thinner, extremely uniform oxide formation with even better thickness control and uniformity. In this example, the dry oxide process is used.

Figure 7D:
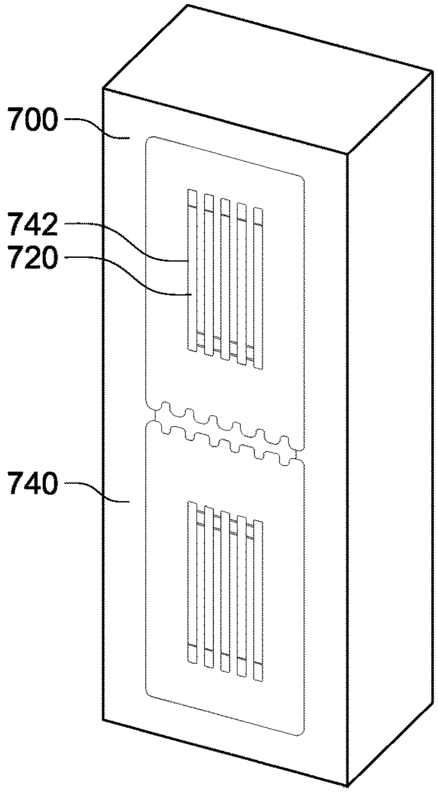

FIG. 7D shows the step of filling the trenches 720 and covering the surface with a polysilicon layer 740. The layer of polysilicon 740 is deposited to cover the oxide layer 730 and fill the space in the trenches 720 between the oxide layer on the sides of the trench to form polysilicon finger structures 742. A LPCVD or APCVD process may be used to deposit the polysilicon 740 in FIG. 7D. Doping is typically performed on the polysilicon layer 740 to allow the polysilicon structures to act as a conductor.

Figure 7E:
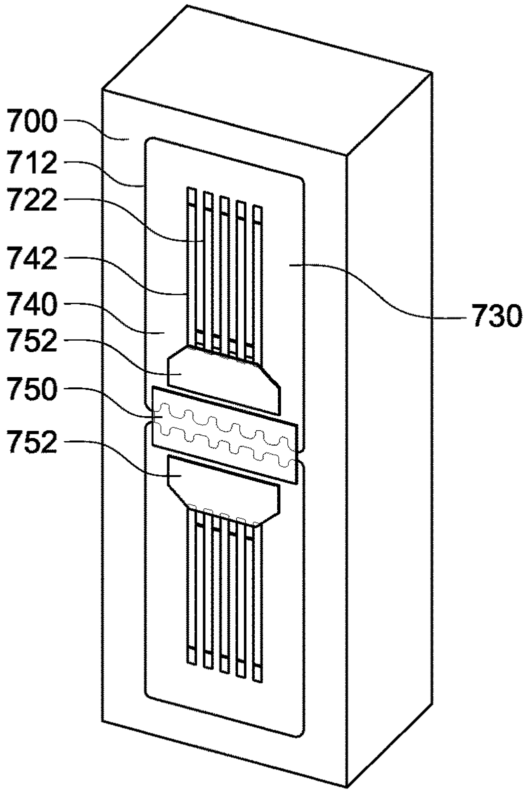

FIG. 7E shows the result of patterning the polysilicon layer 740. The surface polysilicon 740 is patterned to form polysilicon structures on the oxide layer 730. For example, the patterning step may be used to form surface polysilicon structures that can be used as a planar flexure 750 for the actuator device. This step also forms traces of polysilicon 752 which can be used as electrical leads.

Figure 7F:
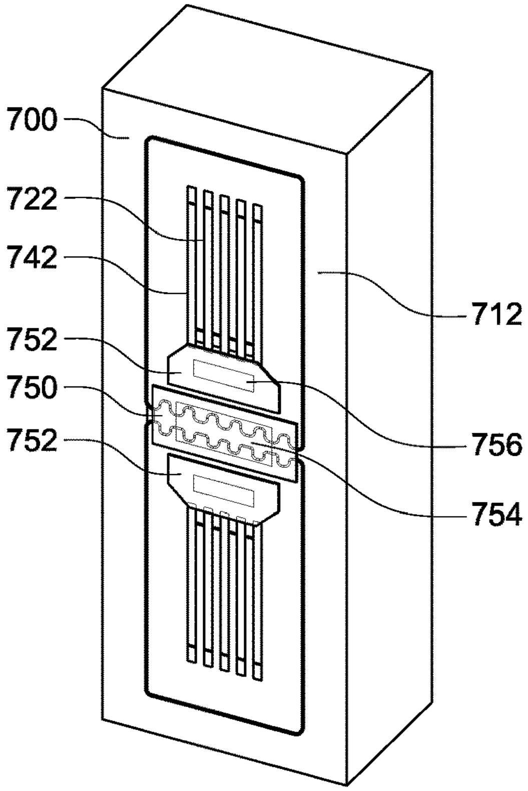

FIG. 7F shows the results of removal of the oxide layer on the sides of the trenches 720. A timed VHF process is used to remove the oxide on the sidewall of the trenches 720, thus producing free-standing structures in the former polysilicon layer 740 in FIG. 7D. The large pads of polysilicon 752 as well as the large area of the flexure 750 can be used to keep oxide in select areas (e.g., oxide pads or in trenches the designer intends to keep oxide in) such as the areas 754 and 756 as the polysilicon 752 and 750 protects such areas from oxide removal steps.

Figure 7G:
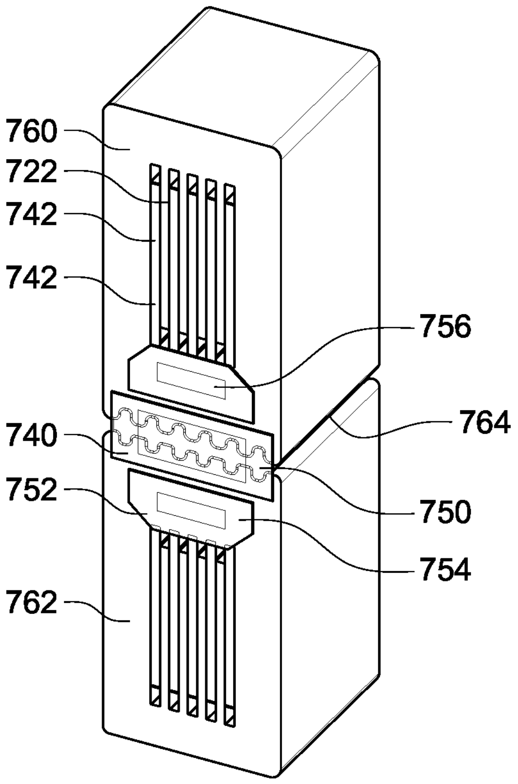

FIG. 7G shows the removal of the sacrificial blocks of oxide defined by the trenches 712 thus forming actuator structures 760 and 762 from the substrate 710. The actuator structures 760 and 762 are joined with each other by a protected oxide layer 764 that remains because it is kept protected by the polysilicon layer 750. This process also frees polysilicon structures such as the fingers 742 that form the moving parts of each of the actuators 760 and 762. The finger gap between the polysilicon fingers 742 and the fingers 722 formed from the substrate is determined by thickness of the sacrificial oxide. Removal of oxide on the sidewalls defined by the trenches 712 frees up blocks of bordering silicon and polysilicon. These blocks may be physically removed (e.g., by gravity) or (optionally) etched away via an additional etching step. The remaining polysilicon finger structures 742 and interlocking silicon fingers 722 form the comb teeth of each of the actuators in the respective structures 760 and 762 that are freed by removal of the surrounding blocks of substrate.

The oxide layer 764 remaining in trenches, which was protected by the polysilicon patch 750, serves to provide mechanical connectivity and electrical isolation for the structures 760 and 762. The isolation can be formed by using a single trench or multiple trenches. The isolation trench may take on different shapes to achieve features such as stress reductions.

Figure 8A:
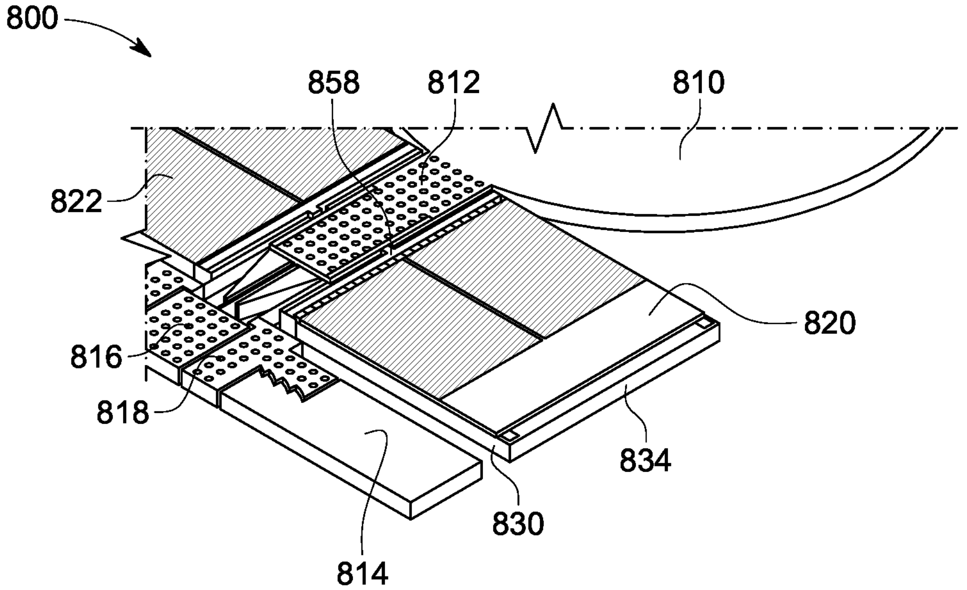
FIG. 8A is a perspective view of the example MEMS comb actuator device in FIGS. 7A-7G with a moveable rotor structure and a stator structure.

FIG. 8A shows an example drive assembly 800 for a mirror 810 that includes two comb-based electrostatic actuators 820 and 822 that is formed in accordance with the fabrication techniques discussed generally herein in relation to the structure 106 in FIG. 1 and specifically in relation to FIGS. 7A-7G. In this example, the actuators 820 and 822 are attached to a side arm 812 that allows rotation of the mirror 810. A frame 814 includes an anchor structure 816 that is fabricated with the frame shape using the techniques described above. A latch 818 is fabricated to be moved to raise the anchor structure 816 and thus the attached side arm 812 and the rotors of the actuators 820 and 822.

In this example, the actuators 820 and actuators 822 are comb type actuators that may be fabricated using the process in FIGS. 7A-7G that allows precise definition of features such as the comb fingers. The example actuator 820 includes a lower stator 830 and an upper rotor 832. The stator 830 and the upper rotor 832 are joined by a hinge 834 that may be fabricated from polysilicon to allow the rotor 832 to rotate relative to the lower stator 830. The stator 830 has a main body 840 that includes an end 842 that is attached to the hinge 834. The opposite end of the main body 840 has a series of fine comb teeth 844. The rotor 832 has a main body 850 that includes an end 852 that is attached to the hinge 834. The opposite end of the main body 850 has a series of fine comb teeth 854. An opposite end structure 856 is attached to a hinge 858 that is attached to the side arm 812. Thus, rotation of the rotor 832 allows the side arm 812 to pivot.

Figure 8B:
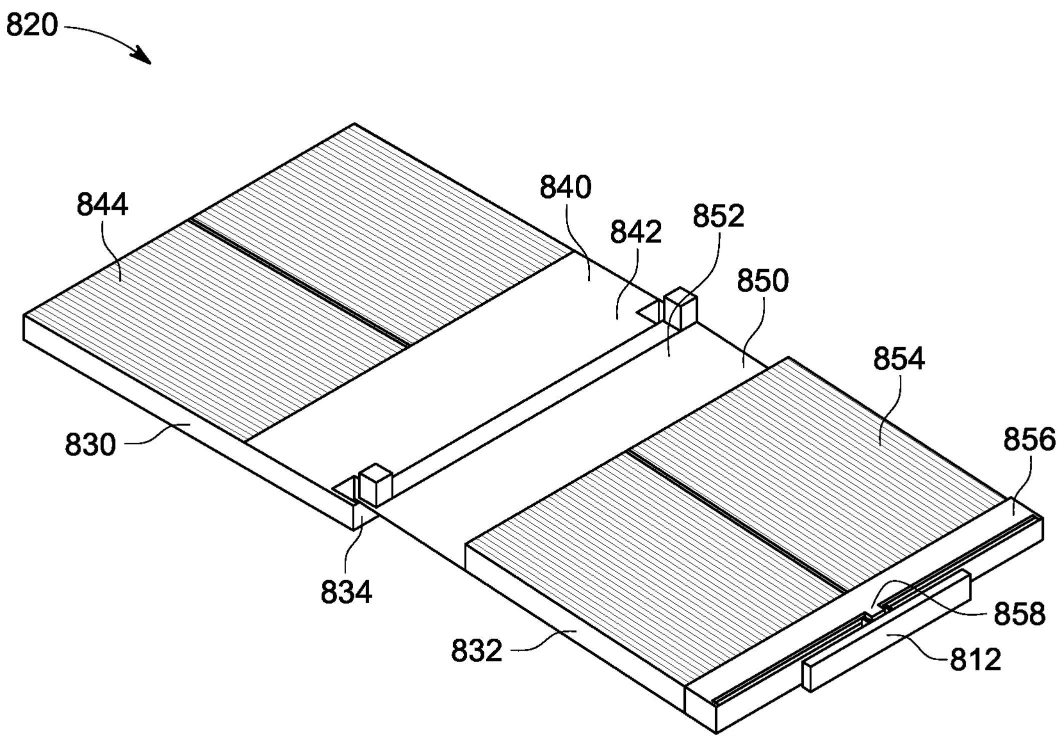
FIG. 8B is an exploded perspective view of the components of the MEMS actuator device in FIG. 8A.
Figure 8C:
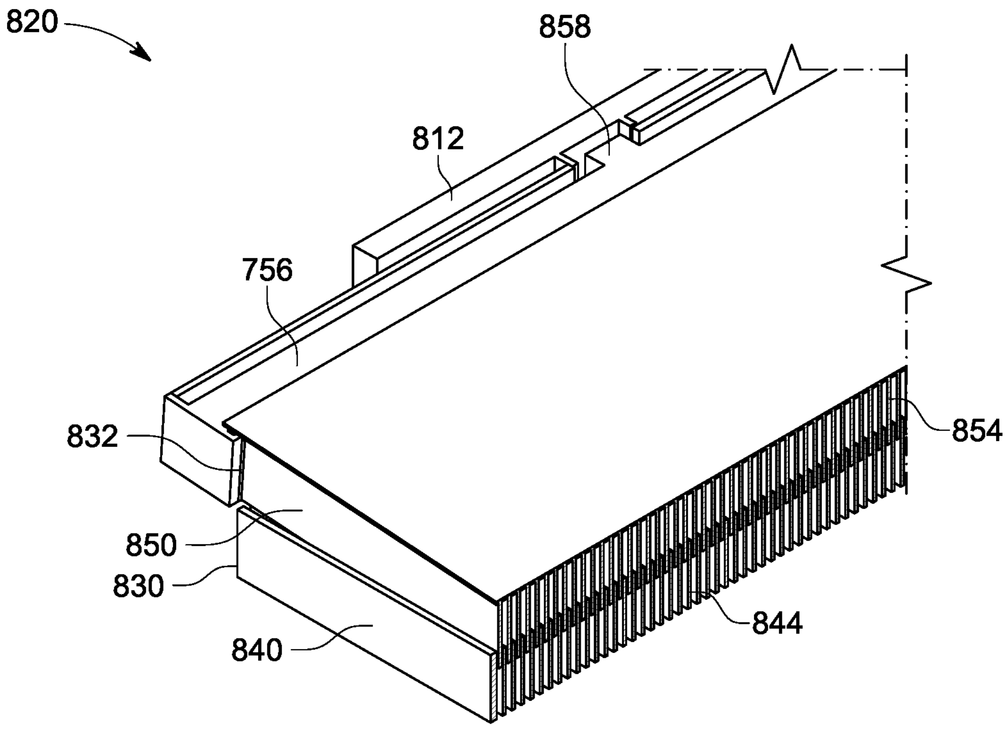
FIG. 8C is a perspective view of the movement of the rotor relative to the stator of the MEMS actuator device in FIG. 8A.

FIG. 8B is a close-up perspective view of the stator 830 and the rotor 832 of the example actuator 820 in an exaggerated rotation around the hinge 834 to show the features of both the stator 830 and the rotor 832. FIG. 8C is a close-up cutaway perspective view of the respective comb teeth 844 and 854 of the stator 830 and the rotor 832. When the rotor 832 is lowered, the teeth 854 interlace with the teeth 844 such that the comb teeth 844 are in proximity with corresponding comb teeth 854 of the upper rotor 832. The example process allows fabricating the comb features to allow electrostatic force to be applied to rotate the rotor 832 around the hinge 834 by applying electrostatic force to the comb teeth 844 of the stator 830. This creates an attractive force with the comb teeth 854 of the rotor 832 causing rotation of the rotor 832 into the stator 830.

In this example, the main body 840 of the stator 830 is fabricated initially from the crystalline substrate. The comb teeth 844 of the stator 830 are formed by etching trenches to define the teeth in silicon as described above. The comb teeth 854 of the rotor 832 are formed by coating the trenches with thermal oxide and then filling the trenches by growing polysilicon to form the comb teeth 854 as explained above. Another layer of polysilicon over the trenches forms the main body 850 and other features of the rotor 832 as explained above in FIG. 7F. Once the thermal oxide is etched away, a gap is formed between the comb teeth 844 and 854.

The comb teeth 854 and 854 of the rotor 832 and the stator 830 are fabricated so that the combs are positioned so they interlace with each other. The gap between the comb teeth 844 and 854 may be defined precisely by the process in FIGS. 7A-7G to form a capacitor for the operation of the actuator 820. The combs take advantage of the precision features that may be produced by the example fabrication methods.

The fabrication with thermal oxide is a uniform process that defines the gap between the comb teeth. The remaining gap is filled with polysilicon to form the comb teeth of the rotor 832 because polysilicon is a good material for filling a narrow gap. The example process creates a super uniform gap between the comb teeth 844 and 854 with a high aspect ratio.

The comb drives such as those for the actuator 820 move in plane and out of plane e.g., back and forth, or up and down. One comb such as the comb teeth 844 for the stator 830 is fabricated from silicon while the other comb such as the comb teeth 854 for the rotor 832 is polysilicon but the example process allows small gaps to be formed on ends. This is superior to known methods of pulling out material from the trenches to define the structures.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware, generalized hardware made specialized by the execution of software thereon that enables the hardware to perform specific function, software stored on a computer-readable medium, or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A method of fabricating a micro-electromechanical systems (MEMS) device, comprising:
- providing a device layer, a handle layer, and a buried oxide layer between the handle layer and the device wafer;
- creating a top trench in a top surface of the device layer;
- creating an oxide layer over the top surface of the device layer and the top trench;
- coating the top of the device layer and the top trench with a first polysilicon layer;
- etching away the oxide layer of the top trench or the top of the device layer to create a structure; and
- creating a bottom trench through the handle layer under the created structure.

2. The method of claim 1, wherein the height of the bottom trench is defined by a length of the handle layer to the buried oxide layer.

3. The method of claim 1, wherein the bottom trench extends through the buried oxide layer and partially through the device layer.

4. The method of claim 3, wherein the structure includes the material of the device layer.

5. The method of claim 3, further comprising:
- fabricating a bottom cap layer having a cavity; and
- bonding the bottom cap layer with a bottom surface of the handle wafer to align the cavity with the bottom trench.

6. The method of claim 1, further comprising:
- fabricating top cap support structures on the device layer; and
- joining a lid to the support structures over the structure to create a hermetic seal over the structure.

7. The method of claim 6, wherein the top cap layer is tilted.

8. The method of claim 1, wherein the top trench is a deep isolation trench extending through the thickness of the device layer to the buried oxide layer, the method further comprising removing material of the device layer along the deep isolation trench to release the structure.

9. The method of claim 1, wherein the top trench is a shallow breakup trench shallower than the thickness of the device layer.

10. The method of claim 1, wherein the structure is formed from the first polysilicon layer in the trench after the oxide layer is etched away.

11. The method of claim 10, wherein the oxide layer is a sacrificial layer of a specified thickness to form a capacitive gap of the specified thickness between the structure and the device layer.

12. The method of claim 1, wherein the structure is defined by the top trench formed from the device layer after the oxide layer is etched away.

13. The method of claim 1, further comprising etching a second trench after the oxide layer is created.

14. The method of claim 1, further comprising:
- providing a second polysilicon layer on the oxide layer; and
- patterning the second polysilicon layer to form a part of the structure.

15. The method of claim 1, further comprising depositing a patterned metal layer on the first polysilicon layer.

16. The method of claim 1, wherein the device is a mirror formed of the patterned metal layer, and wherein the structure may be moved at an angle relative to the surface of the device layer.

17. The method of claim 1, wherein the device layer and the handle layer are fabricated from single crystalline silicon.

18. The method of claim 1, wherein the device is a comb actuator and wherein the structure is a tooth of the comb actuator.

19. The method of claim 1, wherein the oxide layer is formed into a sacrificial block that is etched away to create a large spatial gaps in the structure.

20. A method of fabricating a micro-electromechanical systems (MEMS) comb actuator comprising:
- etching an isolation trench in a substrate layer;
- etching a plurality of finger defining trenches in the substrate layer, wherein the plurality of finger defining trenches are perpendicular to the isolation trench;
- growing an oxide layer to fill the isolation trench and coat the sides of the finger defining trenches;
- growing a polysilicon layer to fill the finger defining trenches; and
- removing the oxide layer coating the sides of the finger defining trenches and the isolation trench to create a plurality of polysilicon fingers separated by a gap from a plurality of fingers of the substrate layer.

* * * * *